(12) United States Patent
de Rochemont

(10) Patent No.: US 9,791,909 B2
(45) Date of Patent: Oct. 17, 2017

(54) HYBRID COMPUTING MODULE

(71) Applicant: L. Pierre de Rochemont, Austin, TX (US)

(72) Inventor: L. Pierre de Rochemont, Austin, TX (US)

( * ) Notice: Subject to any disclaimer, the term of this patent is extended or adjusted under 35 U.S.C. 154(b) by 0 days.

(21) Appl. No.: 15/162,739

(22) Filed: May 24, 2016

(65) Prior Publication Data

US 2017/0031843 A1 Feb. 2, 2017

Related U.S. Application Data

(62) Division of application No. 13/917,607, filed on Jun. 13, 2013, now Pat. No. 9,348,385.

(Continued)

(51) Int. Cl.
| | |
|---|---|
| *G06F 12/00* | (2006.01) |
| *G06F 1/32* | (2006.01) |
| *G06F 1/26* | (2006.01) |
| *H01L 21/762* | (2006.01) |
| *H01L 21/00* | (2006.01) |

(Continued)

(52) U.S. Cl.
CPC .............. *G06F 1/3203* (2013.01); *G06F 1/26* (2013.01); *G06F 1/28* (2013.01); *G06F 1/324* (2013.01); *G06F 9/3001* (2013.01); *G06F 9/30043* (2013.01); *G06F 9/30098* (2013.01); *G06F 9/3802* (2013.01); *G06F 12/0815* (2013.01); *G06F 12/0862* (2013.01); *G06F 12/0875* (2013.01); *G06F 12/1009* (2013.01); *G06F 13/1605* (2013.01); *G06F 13/1673* (2013.01); *G06F 13/1689* (2013.01); *G06F 13/24* (2013.01); *G06F 13/36* (2013.01); *G06F 13/42* (2013.01); *G06F 15/80* (2013.01); *G11C 7/1072* (2013.01); *H01L 21/00* (2013.01); *H01L 21/76229* (2013.01); *H01L 21/84* (2013.01); *H01L 25/0652* (2013.01); *H01L 25/16* (2013.01); *H01L 27/0207* (2013.01); *G06F 2212/1024* (2013.01); *G06F 2212/452* (2013.01); *G06F 2212/602* (2013.01); *G06F 2212/621* (2013.01); *G06F 2212/65* (2013.01); *G06F 2213/0038* (2013.01);

(Continued)

(58) Field of Classification Search
CPC ...... G06F 13/1605; G06F 13/24; G06F 13/36; G06F 13/42; G06F 1/28; G06F 9/30043; G06F 9/3802; G06F 12/0815; G06F 12/0862; G06F 12/0875; G06F 12/1009; G06F 2212/1024; G06F 2212/452; G06F 2212/602; G06F 2212/621; G06F 2213/0038

See application file for complete search history.

(56) References Cited

U.S. PATENT DOCUMENTS

| | | |
|---|---|---|
| 5,707,715 A | 1/1998 | de Rochemont |
| 6,143,432 A | 11/2000 | de Rochemont |

(Continued)

*Primary Examiner* — Shawn X Gu
(74) *Attorney, Agent, or Firm* — Burns & Levinson, LLP; Jerry Cohen; David Gomes

(57) ABSTRACT

A hybrid system-on-chip provides a plurality of memory and processor die mounted on a semiconductor carrier chip that contains a fully integrated power management system that switches DC power at speeds that match or approach processor core clock speeds, thereby allowing the efficient transfer of data between off-chip physical memory and processor die.

38 Claims, 23 Drawing Sheets

Related U.S. Application Data

(60) Provisional application No. 61/776,333, filed on Mar. 11, 2013, provisional application No. 61/669,557, filed on Jul. 9, 2012.

(51) Int. Cl.
| | |
|---|---|
| H01L 27/02 | (2006.01) |
| H01L 21/84 | (2006.01) |
| H01L 25/065 | (2006.01) |
| H01L 25/16 | (2006.01) |
| G06F 9/30 | (2006.01) |
| G06F 9/38 | (2006.01) |
| G06F 12/1009 | (2016.01) |
| G06F 13/16 | (2006.01) |
| G06F 13/24 | (2006.01) |
| G11C 7/10 | (2006.01) |
| G06F 1/28 | (2006.01) |
| G06F 12/0815 | (2016.01) |
| G06F 12/0862 | (2016.01) |
| G06F 12/0875 | (2016.01) |
| G06F 13/36 | (2006.01) |
| G06F 13/42 | (2006.01) |
| G06F 15/80 | (2006.01) |

(52) U.S. Cl.
CPC .. *H01L 2924/0002* (2013.01); *H01L 2924/14* (2013.01); *H01L 2924/3011* (2013.01); *Y10S 257/00* (2013.01)

(56) References Cited

U.S. PATENT DOCUMENTS

| | | |
|---|---|---|
| 6,323,549 B1 | 11/2001 | de Rochemont |
| 7,405,698 B2 | 7/2008 | de Rochemont |
| 7,763,917 B2 | 7/2010 | de Rochemont |
| 8,350,657 B2 | 1/2013 | de Rochemont |
| 8,354,294 B2 | 1/2013 | de Rochemont |
| 8,922,347 B1 | 12/2014 | de Rochemont |
| 2011/0248900 A1 | 10/2011 | de Rochemont |
| 2012/0012403 A1 | 1/2012 | de Rochemont |
| 2012/0043598 A1* | 2/2012 | de Rochemont ...... H01L 23/64 257/300 |
| 2012/0098509 A1 | 4/2012 | de Rochemont |
| 2012/0104358 A1 | 5/2012 | de Rochemont |
| 2013/0061605 A1 | 3/2013 | de Rochemont |

* cited by examiner

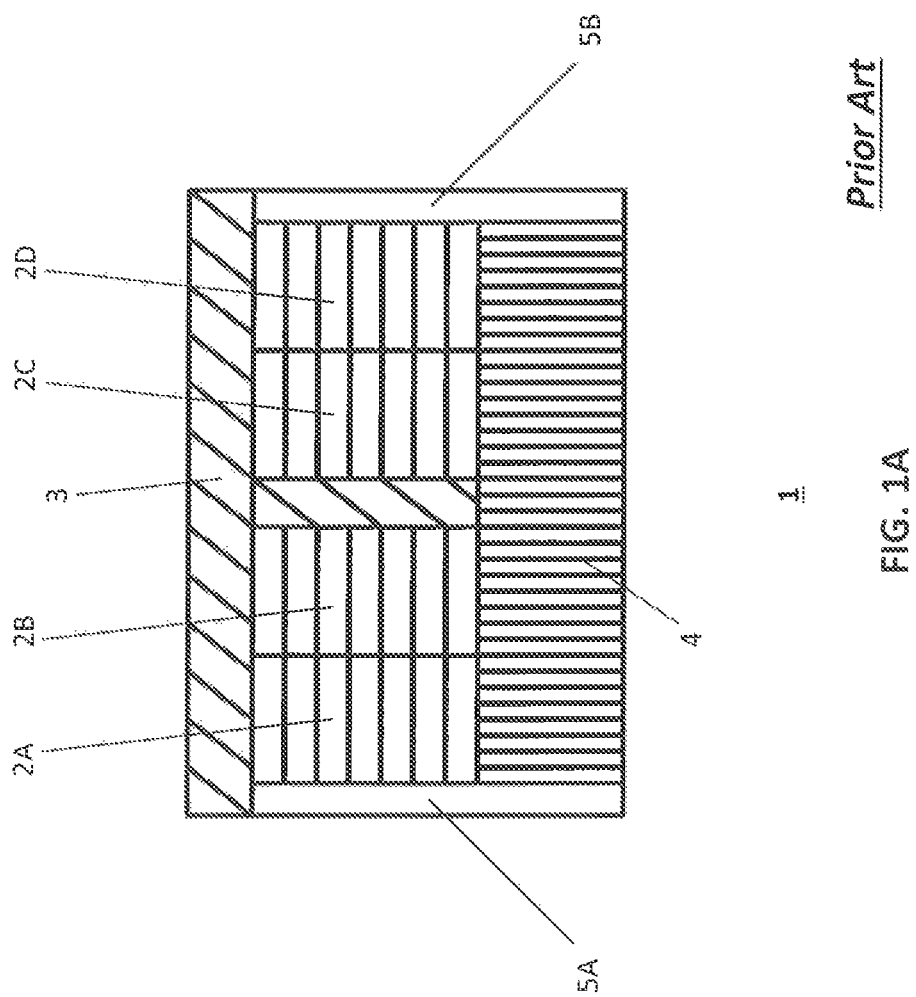

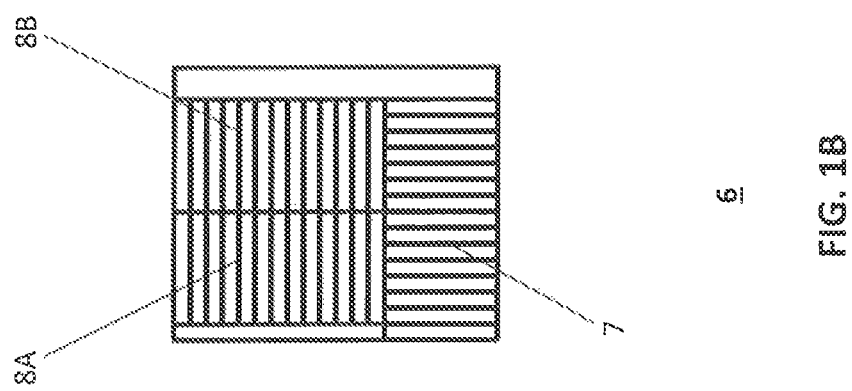

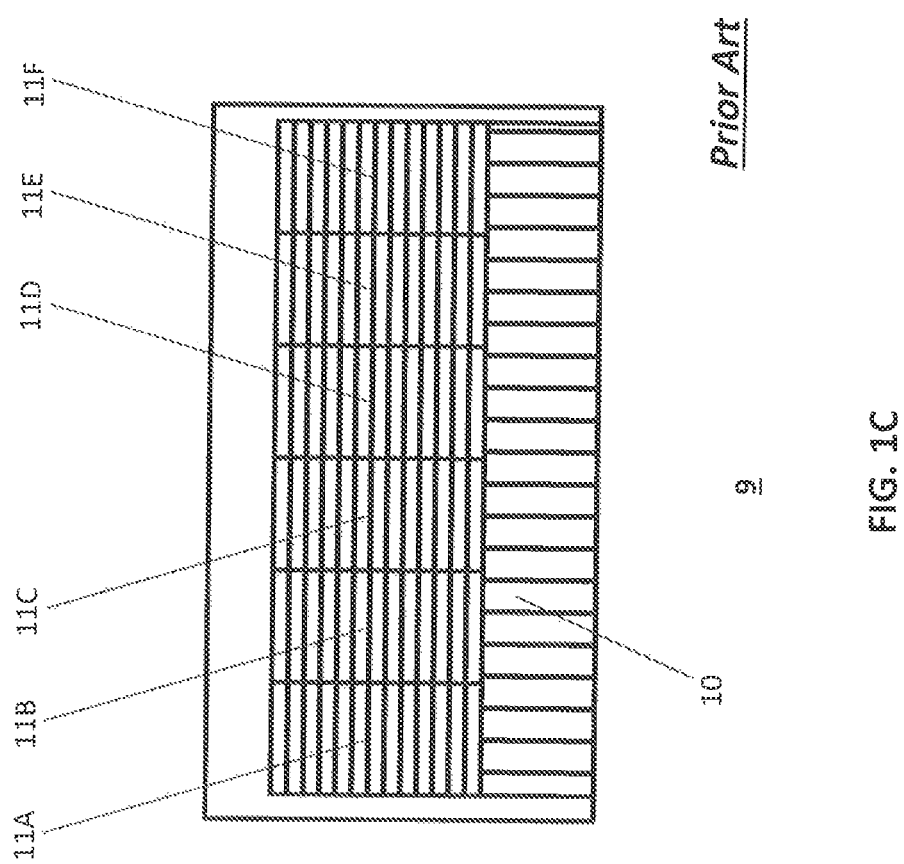

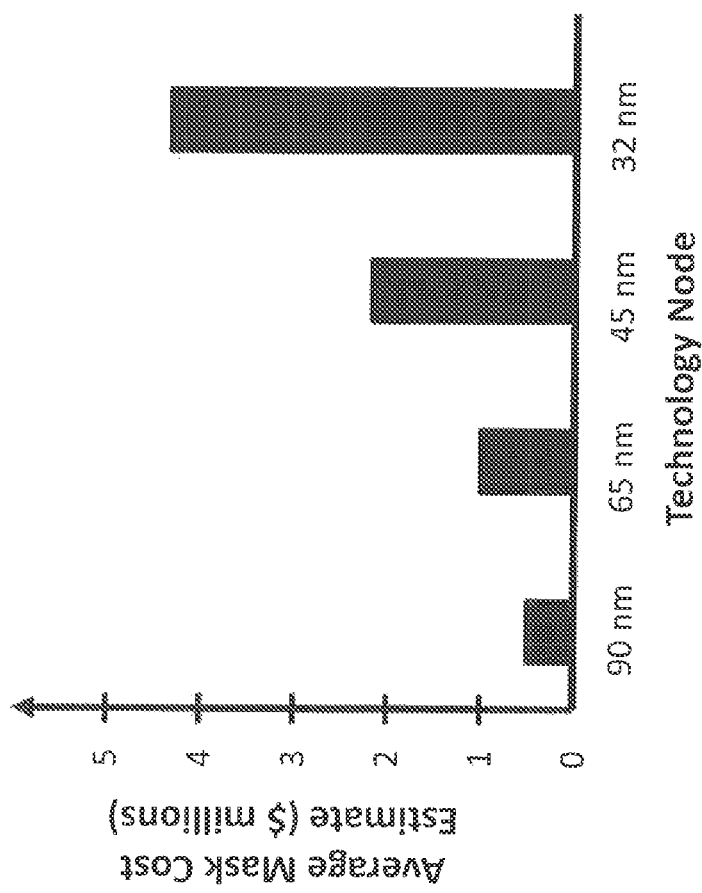

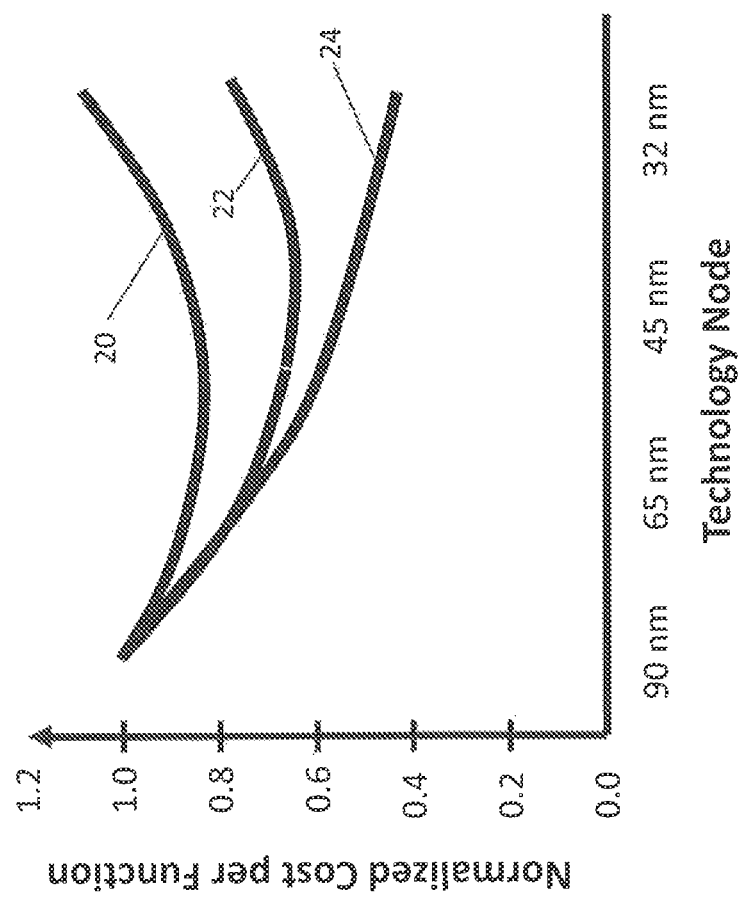

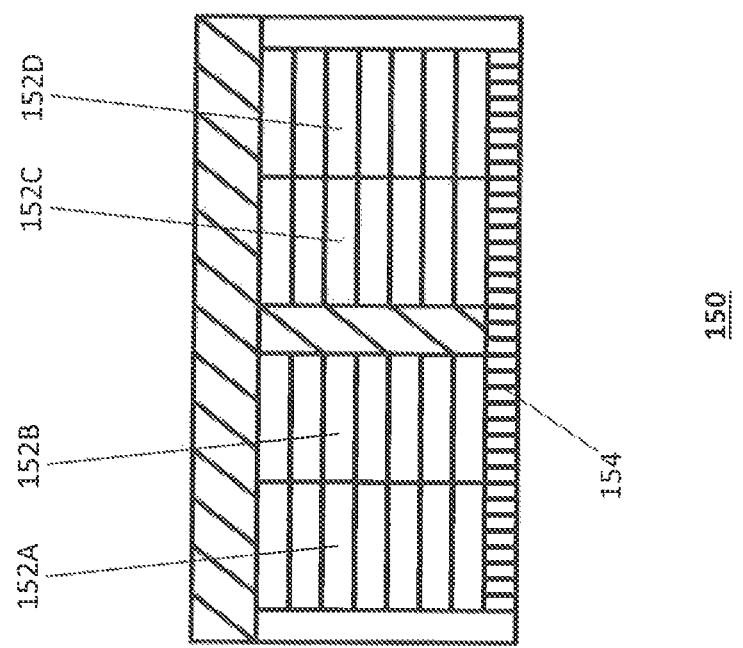

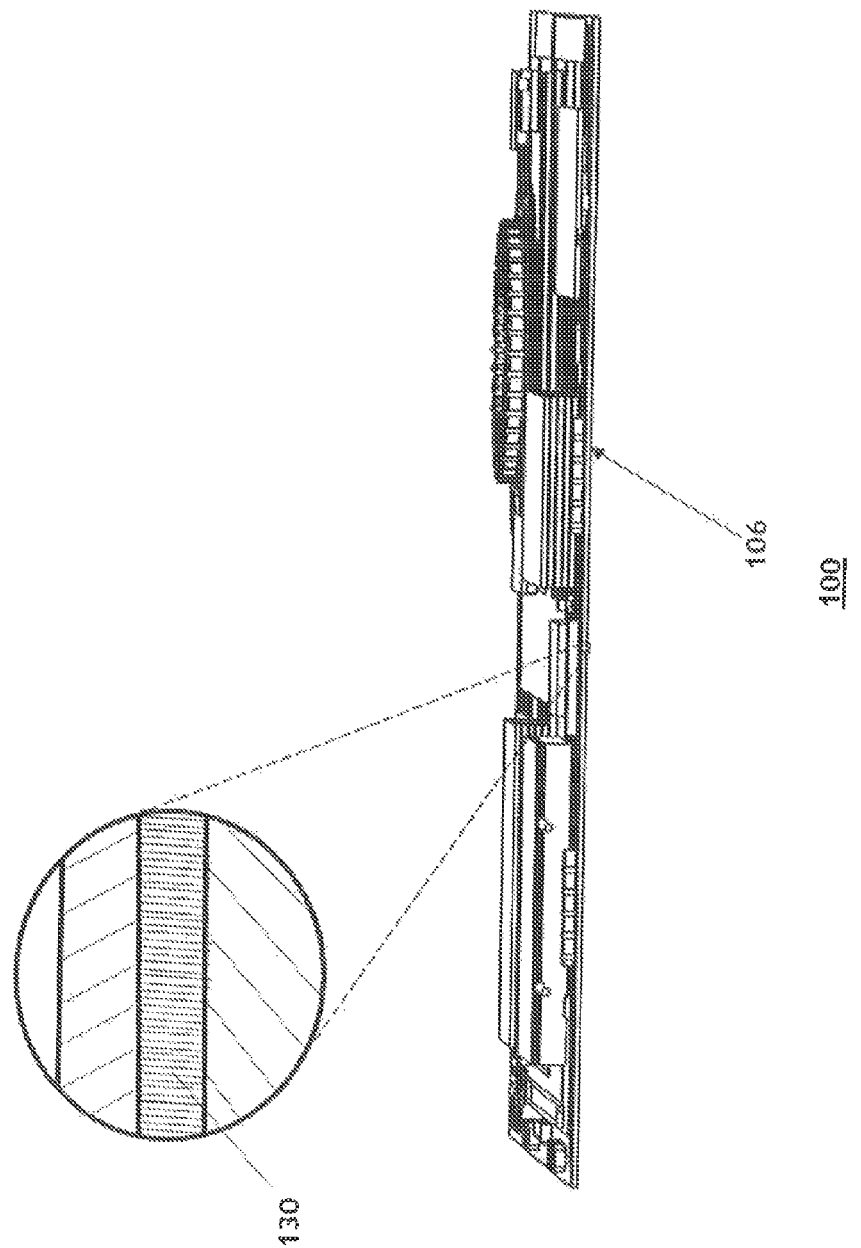

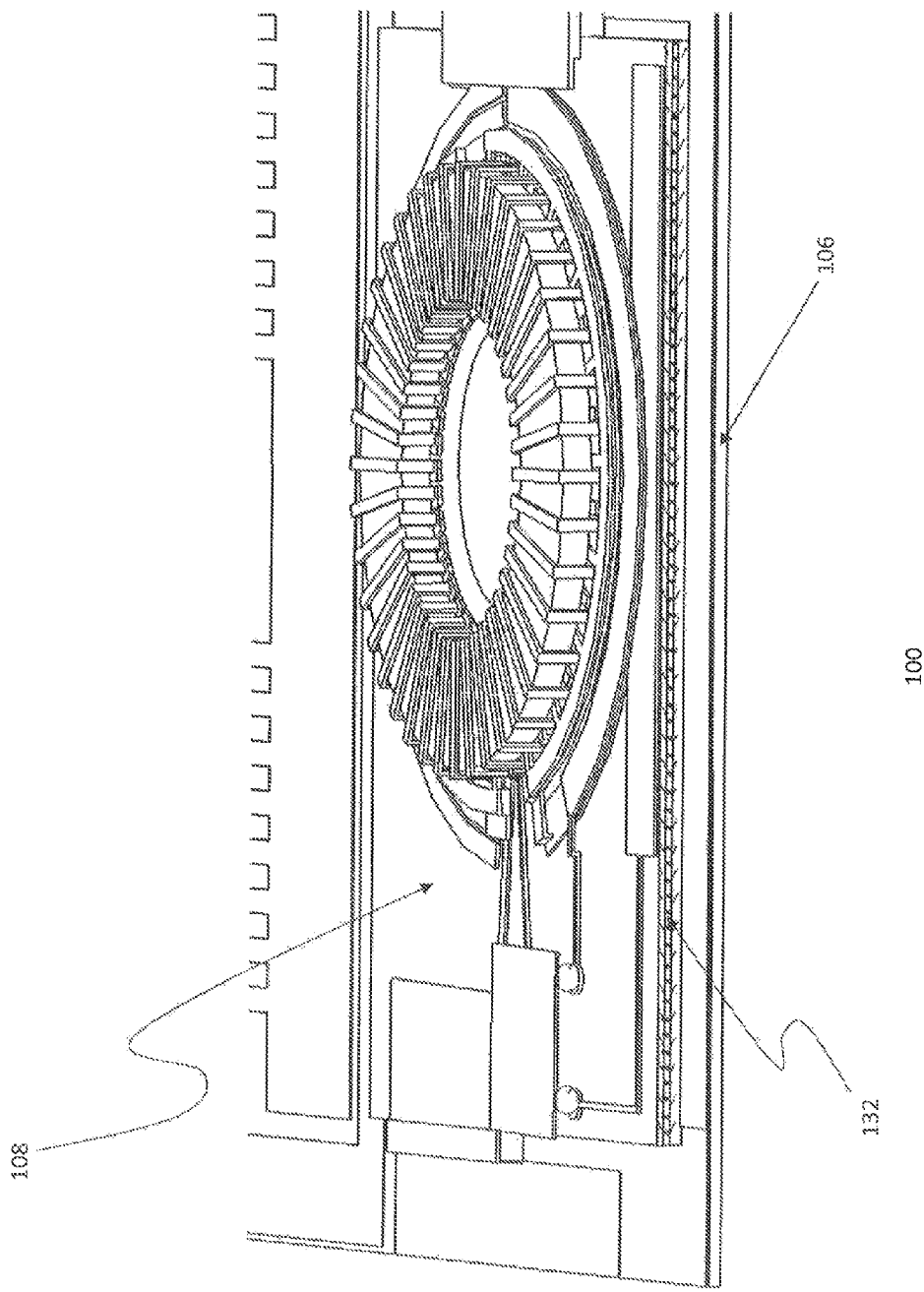

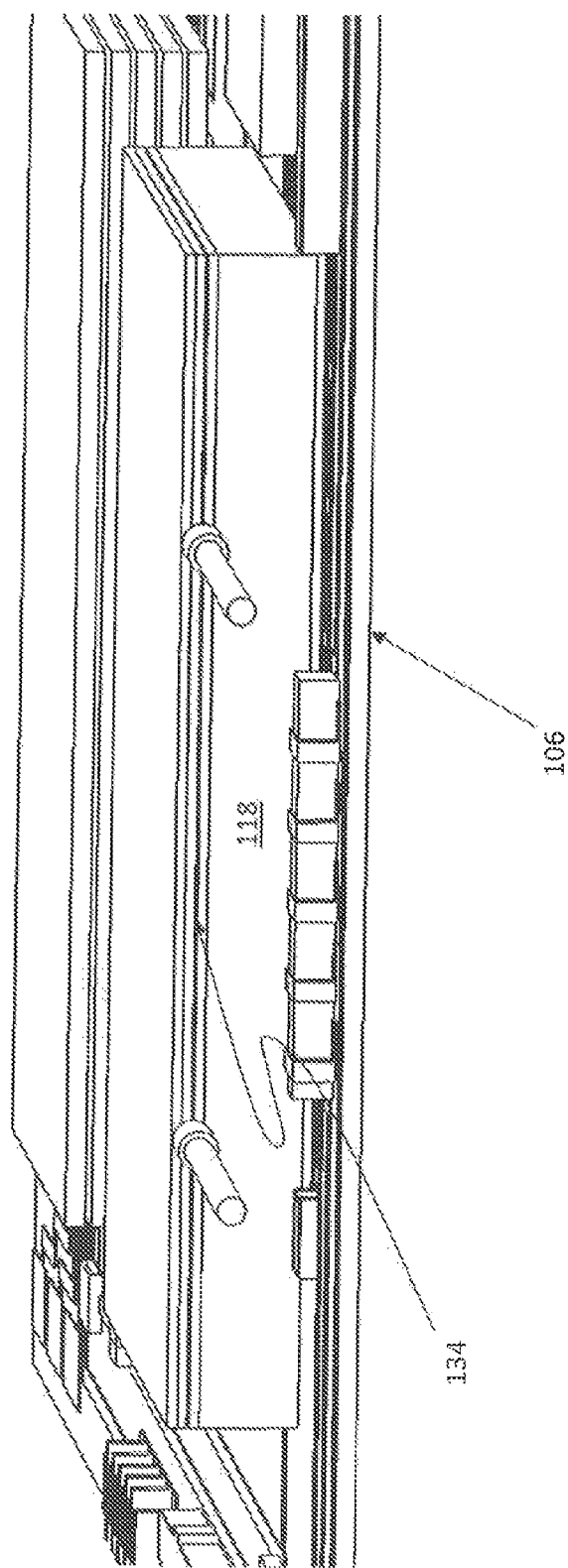

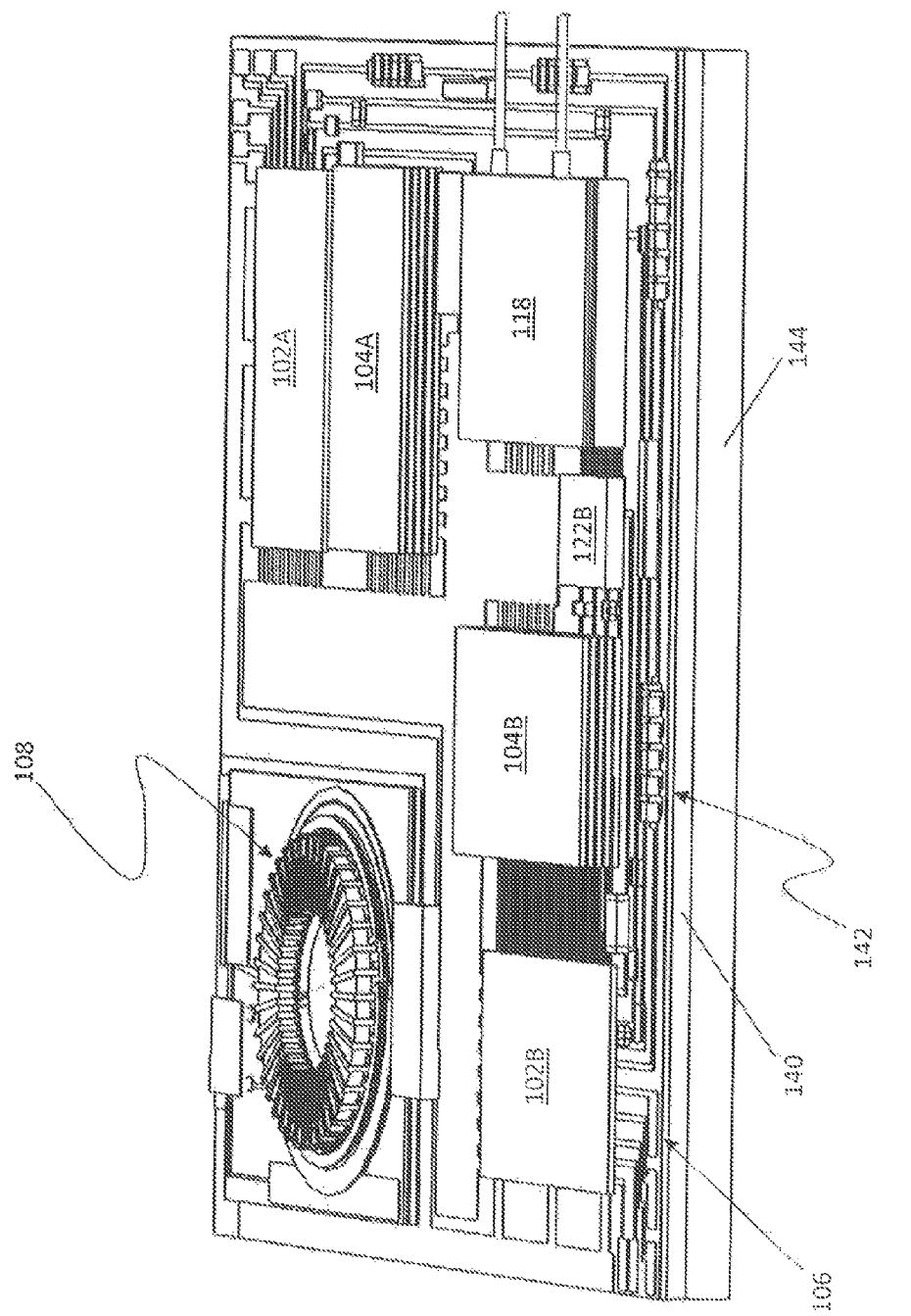

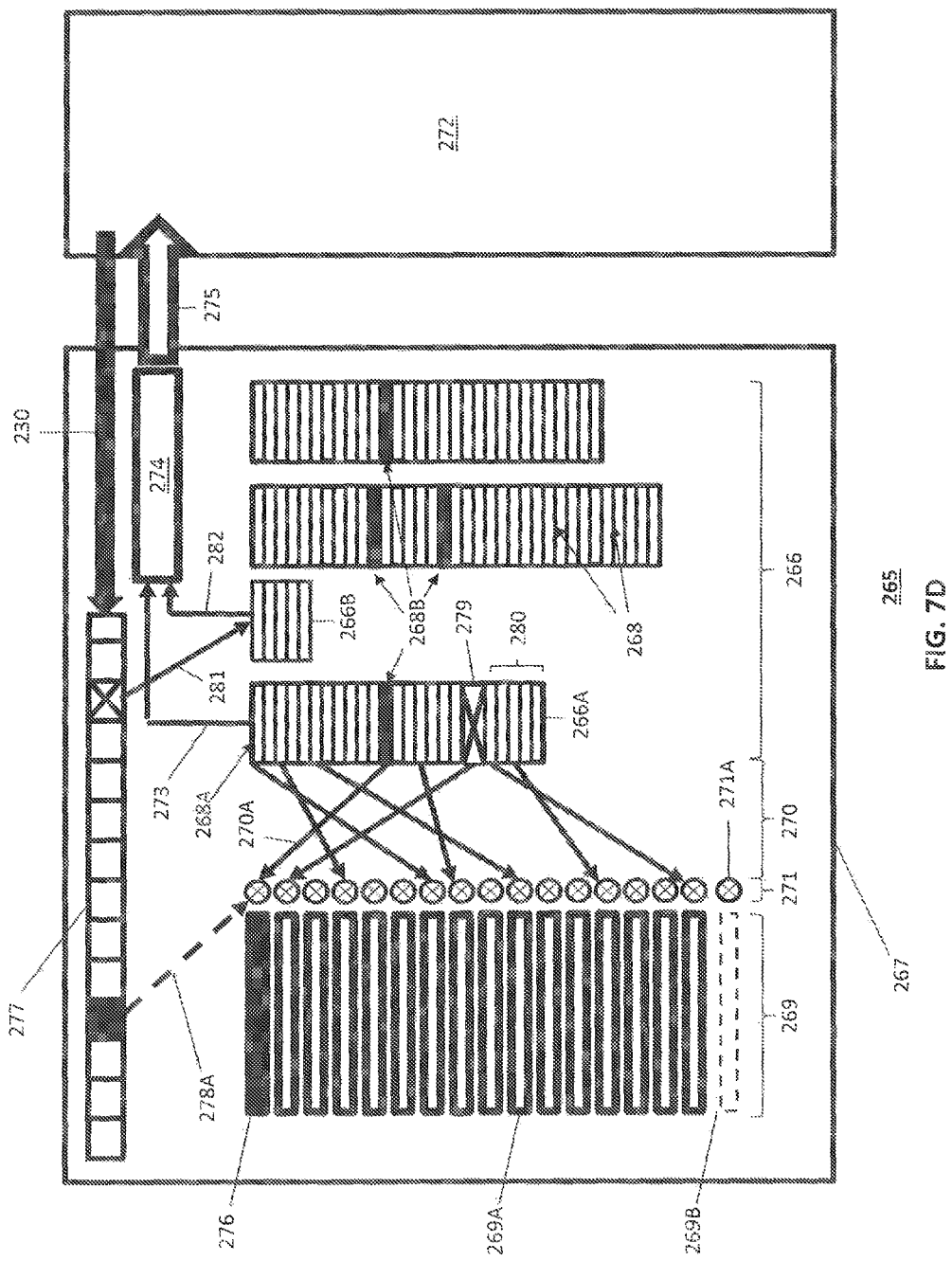

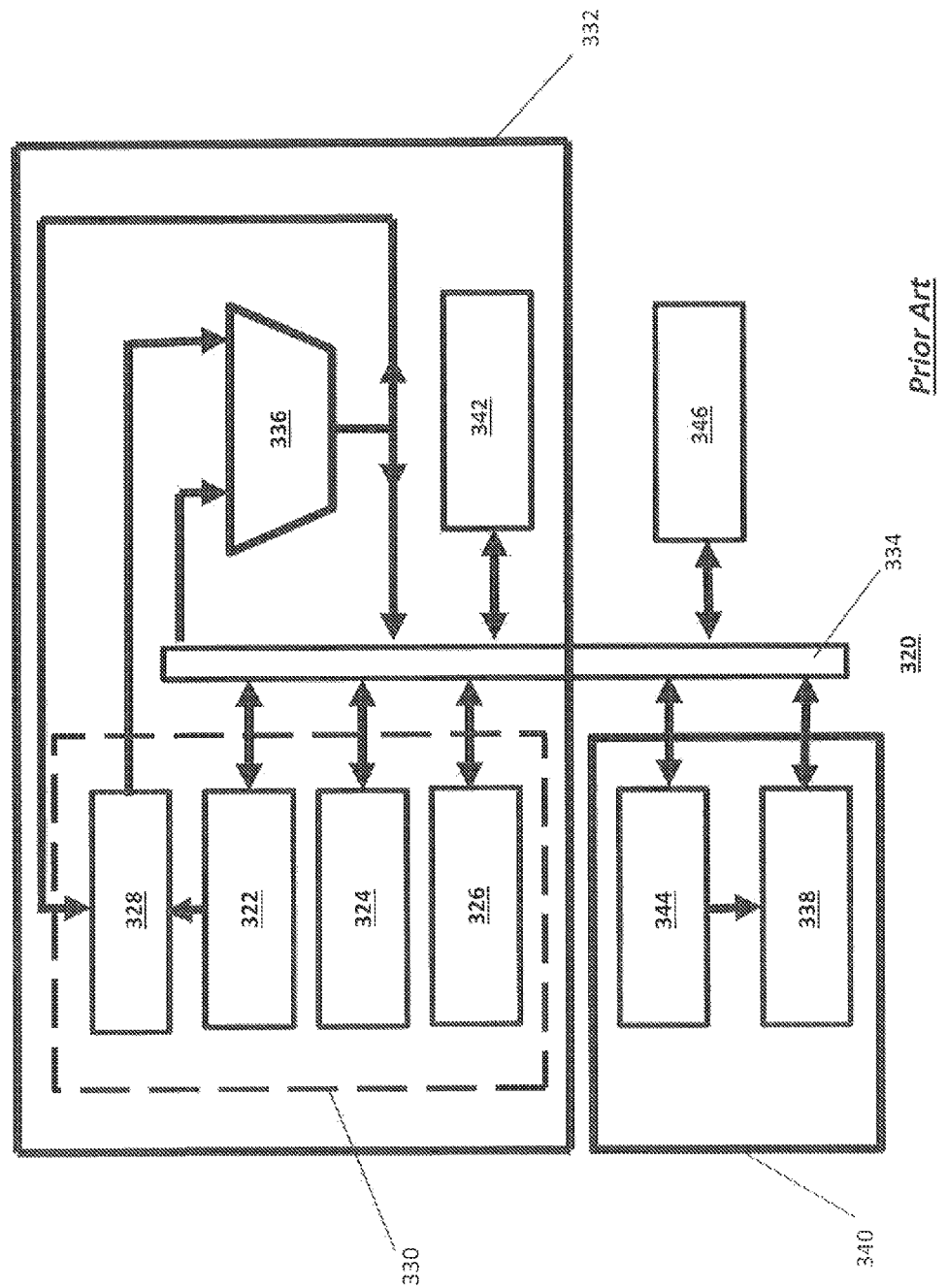
FIG. 8B  *Prior Art*

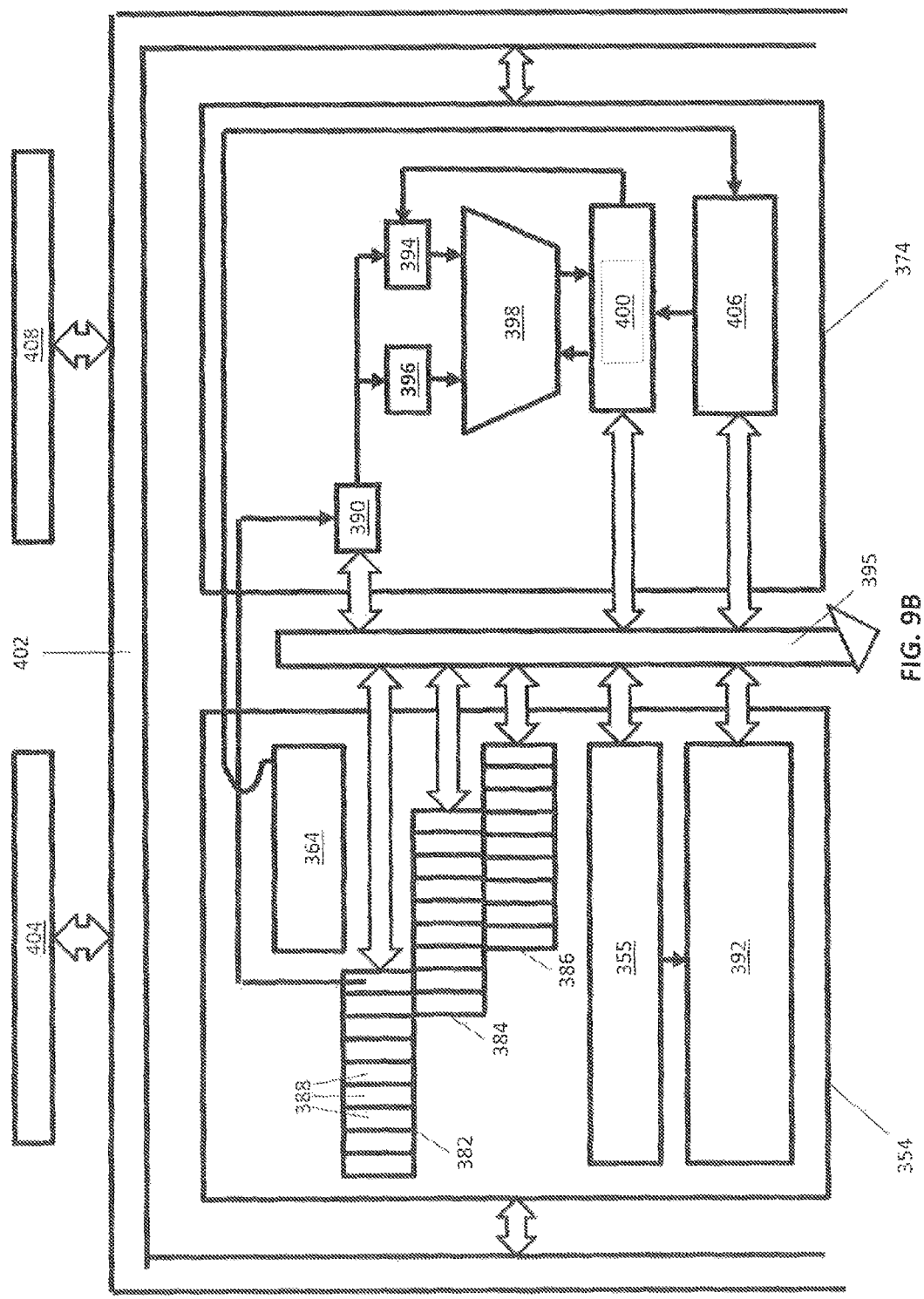

HYBRID COMPUTING MODULE

CROSS REFERENCE TO RELATED APPLICATIONS

This application is a division of co-pending U.S. patent application Ser. No. 13/917,607, filed Jun. 13, 2013, entitled HYBRID COMPUTING MODULE, which in turn claims priority to and benefit of U.S. Provisional Application Nos. 61/669,557, filed Jul. 9, 2012, and 61/776,333, filed Mar. 11, 2013, both of which are incorporated herein by reference in their entirety for all purposes.

FIELD OF THE INVENTION

The present invention relates generally to the construction of customized system-on-chip computing modules and specifically to the application of semiconductor carriers comprising a fully integrated power management system that transfers data between at least one memory die mounted on the semiconductor carrier at speeds that are synchronous or comparable with at least one general purpose processor die co-located on the semiconductor carrier.

The present invention relates generally to methods and means that reduce the physical size and cost of high-speed computing modules. More specifically, the present invention instructs methods and means to flexibly form a hybrid computing module designed for specialized purposes that serve low market volume applications while using lower cost general purpose multi-core microprocessor chips having functional design capabilities that are generally restricted to high-volume market applications. In particular, the invention teaches the use of methods to switch high current (power) levels at high (GHz frequency) speeds by means of semiconductor carrier comprising a fully integrated power management system to maximize utilization rates of multi-core microprocessor chips having considerably more stack-based cache memory with the need for little or no on-board heap-based cache memory, thereby enabling higher performance, smaller overall system size and reduced system cost in specialized low volume market applications.

1. Background to the Invention

Until recently, gains in computer performance have tracked with Moore's law, which states that transistor integration densities will double every 18 months. Although the ability to shrink the size of the transistor has lead to higher switching speeds and lower operating voltages, the ultra-large scale integration densities achievable through modern manufacturing methods has led to a leveling off in corresponding improvements in computer performance due to the large currents needed to power the ultra-large numbers of transistors. Silicon chips manufactured to the 22 nm manufacturing mode will draw 700 W-inch$^2$ of semiconductor die. This large current draw needed to refresh and move data between die and across the surface of a single die has pushed the limitation of conventional power management circuits, which are restricted to significantly lower switching speeds. The large thermal loads generated by conventional power management systems further reduce system efficiency by requiring power management to be located significant distances from the processor and memory die, thereby adding loss through the power distribution network. Therefore, methods that reduce system losses by providing means to fabricate a hybrid computing module comprising power management systems that generate sufficiently low thermal loads to be situated in close proximity to the memory and microprocessor die are desirable.

As is typically the case with transistors, higher power switching speeds are achieved in conventional power management by shrinking the surface area of the transistor gate electrode in power FETs. In conventional transistor architectures switching speeds are limited by gate capacitance, according to the following:

$$f = I_{ON}/(C_{OX} \times W \times L \times V_{dd}) \qquad (1)$$

Where, $f$=limiting switch frequency  (1a)

$I_{ON}$=source current  (1b)

$C_{OX}$=gate capacitance  (1c)

W=gate width  (1d)

L=gate length  (1e)

$V_{dd}$=drain voltage  (1f)

Switching speed/frequency is increased by minimizing gate capacitance ($C_{OX}$), gate electrode surface area (W×L). However, minimizing gate electrode surface areas to achieve high switching speeds imposes self-limiting constraints in high power systems (>100 Watts) when managing large low voltage currents, as the large switched current is forced through small semiconductor volumes. The resultant high current densities generate higher On-resistance, which becomes a principal source for undesirable high thermal loads. Modern computing platforms require very large supply currents to operate due to the ultra-large number of transistors assembled into the processor cores. Higher speed processor cores require power management systems to function at higher speeds. Achieving higher speeds in the power management system's power FET by minimizing gate electrode surface areas creates very high current densities, which in turn generate high thermal loads. The high thermal loads require complex thermal management devices to be designed into the assembled system and usually require the power management and processor systems to be physically separated from one another for optimal thermal management. Therefore, methods and means to produce a hybrid computing module that embeds power management devices in close proximity to the processor cores to reduce loss and contain power FETs that switch large currents comprising several 10's to 100's of amperes at high speeds without generating large thermal loads are desirable.

The inability of modern power management to switch large currents at speeds that keep pace with ultra-large scale integration ("ULSI") transistor switching speeds has led to on-chip and off-chip data bottlenecks as there is insufficient power to transfer data from random-access memory stacks into the processor cores. These bottlenecks leave the individual cores in multi-core microprocessor systems underutilized as it waits for the data to be delivered. Low core utilization rates (<25%) in multi-core microprocessors (quad core and greater) with minimal cache memory have forced manufacturers to add large cache memory banks to the processor die. The popular solution to this problem has been to allocate 30% or more of the modern microprocessor chip to cache memory circuits. In essence, this approach only masks the "data bottleneck" problem caused by having insufficient power to switch data stored nearby in physical random-access memory banks. This requirement weakens the economic impact of Moore's Law by reducing the processor die yield per wafer as the microprocessor die must allocate a substantial surface area to transistor banks that serve non-processor functions compared to the surface area reserved exclusively for logic functionality. The large loss of available processor real estate to cache memory in multi-core x86 processor chips is illustrated in FIGS. 1A, 1B, 1C. FIG. 1A presents a scaled representation of a Nehalem quad-core microprocessor chip 1 fabricated using the 45 nm technology node. The chip's surface area is allocated for 4 microprocessor cores 2A, 2B, 2C, 2D, an integrated 3 Ch DDR3 memory controller 3, and shared L3 cache memory 4. L3 cache memory 4 occupies roughly 40% of the surface area not allocated to system interconnect circuits 5A, 5B, or approximately 30% of the total die surface area. Similarly, the Westmere dual-core microprocessor chip 6 (FIG. 1B) fabricated using the 32 nm technology node allocates approximately 35% of its total available surface area to L3 cache memory 7 to serve its 2 microprocessor cores 8A, 8B. The Westmere-EP 6 core microprocessor chip 9 (FIG. 1C) fabricated using the 32 nm technology node allocates approximately 35% of its total available surface area to L3 cache memory 10 to serve its 6 microprocessor cores 11A, 11B, 11C, 11D, 11E, 11F. Higher semiconductor chip yields (more die per wafer) and lower system costs can be achieved in computing modules that increase the ratio of transistor real estate dedicated to logic functionality over cache memory. Large on-chip cache memory can be eliminated by integrating power management systems into the computing module that switch large currents at speeds that match microprocessor core duty cycles. Therefore, methods and means that boost microprocessor core utilization rates to levels in excess of 50%, preferably in excess of 75%, while maintaining the real estate allocated to cache memory to less than 20%, preferably to less than 10%, of the total die surface area are desirable to minimize module size and cost.

Another major drawback to Moore's Law is the extremely high manufacturing costs at the smaller technology nodes. These extreme costs have potential to greatly restrict the scope of low-cost computing applications in all but the largest applications. FIG. 2A shows the average costs of masks used to photolithographically pattern an individual material layer embedded within an integrated circuit assembly as a function of the manufacturing technology nodes. A key technology objective has been to integrate entire electronic systems on a chip. However, the significantly higher mask costs cause design and lithography costs to skyrocket at the more advanced technology nodes (45 nm & 32 nm). FIG. 2B shows the variation of design and lithography costs per function (memory, processor, controller, etc.) among the different technology nodes (65 nm, 45 nm, 32 nm) normalized to the fabrication cost at the 90 nm technology node for system-on-chip ("SoC") devices serving low volume 20, medium volume 22, and high volume (general purpose) 24 technology applications. The increasing design and lithography costs cause SoC applications fabricated to the more advanced technology nodes (45 nm and 32 nm) to be more expensive in low-volume 20 and medium-volume 22 markets than they would be when fabricated to the less advanced technology nodes (90 nm and 65 nm). These cost constraints cause general purpose SoC applications 24 to be the only instance in which cost, size, and power benefits can be simultaneously achieved with the more advanced technology nodes. Markets are not monolithic, which causes low and medium applications to dominate overall market volumes in the aggregate. Therefore methods and means that allow the cost savings, size, and power savings achieved with general purpose system semiconductor systems made through the more advanced technology nodes (45 nm, 32 nm, and beyond) to be integrated into hybridized SoC designs serving the wider utility low-volume and medium-volume market applications are desirable.

2. Overview of the Related Art

The ability for the semiconductor industry to shrink the size of individual transistors so the number of transistors that can be integrated into a square unit of a silicon chip's surface doubles every year has propelled computing performance on a path of exponential growth. While this path has led to exponential growth in computing performance, and substantial reductions in chip unit costs, Moore's Law has had some consequences that have started restricting the industry's options. First, the design, mask, and fabrication costs have grown exponentially. Secondly, limitations related to the long design times and extremely high foundry costs have thinned the number of chip producers in the marketplace. Lastly, as emphasized below, the inadequacy of signal routing through printed circuit boards has forced more circuit functionality to be integrated onto a single chip.

Current industry roadmaps envision a complete System-on-Chip ("SoC"), which places all circuit functionality (processors, memory, field programmability, etc.) on a single semiconductor chip. This perception has emerged from recent history. As signal routing through printed circuit boards inhibited the ability to transfer data from main memory at microprocessor clock speeds, cache memory banks became a requirement for all CPU's. As cache memory management caused a single threaded CPU to generate more heat than can be reasonably transferred using market acceptable thermal management solutions, multi-core processors were developed to drive large number of transistors at higher speeds in parallel to keep pace with the exponential growth in performance demanded by the marketplace. It is now generally accepted that in 2015, it will no longer be possible to supply sufficient power to multi-core microprocessors to drive all the transistors and higher speeds. The current solution being proposed by the industry is to integrate the full functionality of all circuitry onto a single SoC. While this will not allow all transistor to be operating simultaneously, nor will it allow them all to operating at higher speeds, this proposed solution will keep pace with the exponential growth curve the industry is accustomed to.

The problem with this solution will be marketplace acceptance. In 1996, National Semiconductor had acquired all the intellectual property needed to integrate a laptop computer onto a single chip. While elegant, this solution failed for several reasons. First, the marketplace was too fragmented for a one-size-fits-all solution. Secondly, the marketplace was changing too fast to digest the 2-year minimum design cycles needed to produce the one-size-fits-all solution. Economic history has clearly demonstrated that flexible hybrid solutions are much preferred solutions to system consolidation in the broader marketplace.

Definition of Terms

The terms "active component" or "active element" is herein understood to refer to its conventional definition as an element of an electrical circuit that that does require electrical power to operate and is capable of producing power gain.

The term "atomicity" is herein understood to refer to its conventional meaning with regards to computing and programmatic memory usage as an indivisible block of programming code that defines an operation that either does not happen at all or is fully completed when used.

The term "cache memory" herein refers to its conventional meaning as an electrical bit-based memory system that is physically located on the microprocessor die and used to store stack variables and main memory pointers or addresses.

The terms "chemical complexity", "compositional complexity", "chemically complex", or "compositionally complex" are herein understood to refer to a material, such as a metal or superalloy, compound semiconductor, or ceramic that consists of three (3) or more elements from the periodic table.

The term "chip carrier" is herein understood to refer to an interconnect structure built into a semiconductor substrate that contains wiring elements and active components that route electrical signals between one or more integrated circuits mounted on chip carrier's surface and a larger electrical system that they may be connected to.

The term "coherency" or "memory coherence" is herein understood to refer to its conventional meaning with regards to computing and programmatic memory usage as an issue that affects the design of computer systems in which two or more processors or cores share a common area of memory and the processors are notified of changes to shared data values in the common memory location when it is updated by one of the processing elements.

The term "consistency" or "memory consistency" is herein understood to refer to its conventional meaning with regards to computing and programmatic memory usage as a model for distributed shared memory or distributed data stores (file systems, web caching, databases, replication systems) that specifies rules that allow memory to be consistent and the results of memory operations to be predictable.

The term "computing system" is herein understood to mean any microprocessor-based system comprising a register compatible with 32, 64, 128 (or any integral multiple thereof) bit architectures that is used to electrically process data or render computational analysis that delivers useful information to an end-user.

The term "critical performance tolerances" is herein understood to refer to the ability for all passive components in an electrical circuit to hold performance values within ±1% of the desired values at all operating temperatures over which the circuit was designed to function.

The term "die" is herein understood to refer to its conventional meaning as a sectioned slide of semiconductor material that comprises a fully functioning integrated circuit.

The term "DMA" or Direct Memory Access is herein understood to mean a method by which devices either external or internal to the systems chassis, having a means to bypass normal processor functionality, updates or reads main memory and signals the processor(s) the operation is complete. This is usually done to avoid slow memory controller functionality and or in cases where normal processor functionality is not needed.

The term "electroceramic" is herein understood to refer to its conventional meaning as being a complex ceramic material that has robust dielectric properties that augment the field densities of applied electrical or magnetic stimulus.

The term "FET" is herein understood to refer to its generally accepted definition of a field effect transistor wherein a voltage applied to an insulated gate electrode induces an electrical field through insulator that is used to modulate a current between a source electrode and a drain electrode.

The term "heap memory" is herein understood to refer to its conventional meaning with regards to computing and programmatic memory usage as a large pool of memory, generally located in RAM, that has divisible portions dynamically allocated for current and future memory requests.

The term "Hybrid Memory Cube" is herein understood to refer a DRAM memory architecture that combines high-speed logic processing within a stack of through-silicon-via bonded memory die and is under development through the Hybrid Memory Cube Consortium.

The term "integrated circuit" is herein understood to mean a semiconductor chip into which a large, very large, or ultra-large number of transistor elements have been embedded.

The term "kernel" is herein understood to refer to its conventional meaning in computer operating systems as the communications interface between the computing applications and the data processing hardware and manages the system's lowest-level abstraction layer controlling basic processor and I/O device resources.

The "latency" or "column address strobe (CAS) latency" is the delay time between the moment a memory controller tells the memory module to access a particular memory column on a random-access memory (RAM) module and the moment the data from the given memory location is available on the module's output pins.

The term "LCD" is herein understood to mean a method that uses liquid precursor solutions to fabricate materials of arbitrary compositional or chemical complexity as an amorphous laminate or free-standing body or as a crystalline laminate or free-standing body that has atomic-scale chemical uniformity and a microstructure that is controllable down to nanoscale dimensions.

The terms "main memory" or "physical memory" are herein understood to refer to their conventional definitions as memory that is not part of the microprocessor die and is physically located in separate electronic modules that are linked to the microprocessor through input/output (I/O) controllers that are usually integrated into the processor die.

The term "ordering" is herein understood to refer to its conventional meaning with regards to computing and programmatic memory usage as a system of special instructions, such as memory fences or barriers, which prevent a multi-threaded program from running out of sequence.

The term "passive component" is herein understood to refer to its conventional definition as an element of an electrical circuit that that modulates the phase or amplitude of an electrical signal without producing power gain.

The term "pipeline" or "instruction pipeline" is herein understood to refer to a technique used in the design of computers to increase their instruction throughput, (the number of instructions that can be executed in a unit of time), by running multiple operations in parallel.

The term "processor" is herein understood to be interchangeable with the conventional definition of a microprocessor integrated circuit.

The term "RISC" is herein understood to refer to its conventional meaning with regards to computing systems as a microprocessor designed to perform a smaller number of computer instruction types, wherein each type of computer instruction utilizes a dedicated set of transistors so the lower number of instruction types reduces the microprocessor's overall transistor count.

The term "resonant gate transistor" is herein understood to refer to any of the transistor architectures disclosed in de Rochemont, U.S. Ser. No. 13/216,192, "POWER FET WITH A RESONANT TRANSISTOR GATE", wherein the transistor switching speed is not limited by the capacitance of the transistor gate, but operates at frequencies that cause the gate capacitance to resonate with inductive elements embedded within the gate structure.

The term "shared data" is herein understood to refer to its conventional meaning with regards to computing and programmatic memory usage as data elements that are simultaneously used by two or more microprocessor cores.

The term "stack" or "stack-based memory allocation" is herein understood to refer to its conventional meaning with regards to computing and programmatic memory usage as regions of memory reserved for a thread where data is added or removed in a last-in-first-out protocol.

The term "stack-based computing" is herein understood to describe a computational system that primarily uses a stack-based memory allocation and retrieval protocol in preference to conventional register-cache computational models.

The term "standard operating temperatures" is herein understood to mean the range of temperatures between −40° C. and +125° C.

The term "thermoelectric effect" is herein understood to refer to its conventional definition as the physical phenomenon wherein a temperature differential applied across a material induces a voltage differential within that material, and/or an applied voltage differential across the material induces a temperature differential within that material.

The term "thermoelectric material" is herein understood to refer to its conventional definition as a solid material that exhibits the "thermoelectric effect".

The terms "tight tolerance" or "critical tolerance" are herein understood to mean a performance value, such as a capacitance, inductance, or resistance that varies less than ±1% over standard operating temperatures.

The term "visibility" is herein understood to refer to its conventional meaning with regards to computing and programmatic memory usage as the ability of, or timeliness with which, other threads are notified of changes made to a current programming thread.

The term "II-VI compound semiconductor" is herein understood to refer to its conventional meaning describing a compound semiconductor comprising at least one element from column IIB of the periodic table including: zinc (Zn), cadmium (Cd), or mercury (Hg); and, at least one element from column VI of the periodic table consisting of: oxygen (O), sulfur (S), selenium (Se), or tellurium (Te).

The term "III-V compound semiconductor" is herein understood to refer to its conventional meaning describing a compound semiconductor comprising at least one semi-metallic element from column III of the periodic table including: boron (B), aluminum (Al), gallium (Ga), and indium (In); and, at least one gaseous or semi-metallic element from the column V of the periodic table consisting of: nitrogen (N), phosphorous (P), arsenic (As), antimony (Sb), or bismuth (Bi).

The term "IV-IV compound semiconductor" is herein understood to refer to its conventional meaning describing a compound semiconductor comprising a plurality of elements from column IV of the periodic table including: carbon (C), silicon (Si), germanium (Ge), tin (Sn), or lead (Pb).

The term "IV-VI compound semiconductor" is herein understood to refer to its conventional meaning describing a compound semiconductor comprising at least one element from column IV of the periodic table including: carbon (C), silicon (Si), germanium (Ge), tin (Sn), or lead (Pb); and, at least one element from column VI of the periodic table consisting of: sulfur (S), selenium (Se), or tellurium (Te).

SUMMARY OF THE INVENTION

The present invention generally relates to a hybrid system-on-chip that comprises a plurality of memory and processor die mounted on a semiconductor carrier chip that contains a fully integrated power management system that switches DC power at speeds that match or approach processor core clock speeds, thereby allowing the efficient transfer of data between off chip physical memory and processor die. The present invention relates to methods and means to reduce the size and cost of computing systems, while increasing performance. The present invention relates to methods and means to provide a factor increase in computing performance per processor die surface area while only fractionally increasing power consumption.

One embodiment of the present invention provides a hybrid computing module comprising: a plurality of semiconductor die mounted upon a semiconductor carrier comprising a substrate that provides electrical communication between the plurality of said semiconductor die through electrically conducting traces and passive circuit network filtering elements formed upon the carrier substrate; a fully integrated power management circuit module having a resonant gate transistor that switches electrical current in excess of 0.005 A at speeds that synchronously transfer data and digital process instruction sets between said plurality of semiconductor die; at least one microprocessor die among the plurality of semiconductor die, and a memory bank.

The hybrid computing module may include an additional fully integrated power management module that is frequency off-stepped from the fully integrated power module to supply power to circuit elements at a slower switching speed. The additional fully integrated power management module may supply power to a baseband processor. The plurality of semiconductor die may provide field programmability, main memory control/arbitration, application-specific, bus management, or analog-to-digital and/or digital-to-analog functionality. The microprocessor die may be a CPU or GPU. The microprocessor die may comprise multiple processing cores. The plurality of semiconductor die may provide CPU and GNU functionality.

The substrate forming the semiconductor carrier may be electrically insulating having an electrical resistivity greater than $10^{10}$ ohm-cm. The electrically insulating substrate may be a MAX-Phase material having a thermal conductivity greater than 100 $W \cdot m^{-1} \cdot K^{-1}$. The semiconductor carrier substrate may be a semiconductor. The semiconductor substrate forming the semiconductor carrier may be silicon, germanium, silicon-germanium, or a III-V compound semiconductor. The active circuitry may be embedded in the semiconductor substrate. The active circuitry may manage USB, audio, video or other communications bus interface protocols. The active circuitry may be timing circuitry.

The microprocessor die may contain a cache memory that is less than 16 mega-bytes per processor core or less than 128 kilo-bytes per processor core. The memory bank may be a Hybrid Memory Cube. The memory bank may comprise static dynamic random-access memory functionality. The microprocessor die may serve 32-bit, 64-bit, 128-bit (or larger) computing architectures.

The hybrid computing module may contain a plurality of central processing units, each functioning as distributed processing cores. The hybrid computing module may contain a plurality of central processing units that are configured to function as a fault-tolerant computing system. The hybrid computing module may be in thermal contact with a thermoelectric device. The hybrid computing may further comprise an electro-optic interface.

Another embodiment of the present invention provides a memory management architecture comprising: a hybrid computer module that includes a plurality of discrete semiconductor die mounted upon a semiconductor carrier, which plurality of discreet semiconductor die further comprise: a fully integrated power management module that contains a resonant gate transistor; wherein the fully integrated power management module synchronously switches power at speeds that match the clock speed of an adjacent microprocessor die mounted within the hybrid computer module to provide real-time memory access; a look-up table that selects a pointer which references addresses in a main memory where data and/or processes are physically located; an interrupt bus that halts processor loads when an alert is registered by a program jump or a change in a global variable; a memory management variable that uses the look-up table to select the next set of data and/or processes called by the microprocessor, reassign and allocate addresses to match requirements of processed data or updated processes as they are loaded in and out of a processing unit; and, a memory bank.

The memory management architecture may have ≤45% of the transistors comprising the processor die circuitry tasked with managing fetch/store code instructions. The memory management architecture may have ≤25% of the microprocessor die's circuitry dedicated to servicing "fetch"/"store" code instructions. The memory bank may be a Hybrid Memory Cube. A hybrid computing module may utilize an algorithm to provide cache memory hit-miss prediction. A hybrid computing module may not utilize a predictive algorithm to manage cache memory loading. The program stacks may include a sequenced list of pointers that direct the memory controller to the physical locations in main memory where the referenced data, process, or instruction set can be copied and loaded into the processor core. The memory bank may be a static dynamic random-access memory. The fully integrated power management module may switch power at speeds greater than 250 MHz., or at speeds in the range of 600 MHz to 60 GHz. The memory management architecture may operate within a 32-bit, 64-bit, 128-bit computing platform.

Yet another embodiment of the present invention provides a general purpose computational operating system, comprising a hybrid computer module, which further comprises: a semiconductor chip carrier having electrical traces and passive component networks monolithically formed on a surface of the chip carrier to maintain and manage electrical signal communications between: a microprocessor die mounted on the chip carrier; a memory bank consisting of at least one discrete memory die mounted on the semiconductor chip carrier adjacent to the microprocessor die; a fully integrated power management module having an embedded resonant gate transistor that synchronously transfers data from main memory to the microprocessor at processor clock speed; a memory management architecture and operating system that compiles program stacks as a collection of pointers to the addresses where elemental code blocks are stored in main memory; a memory controller that sequentially references the pointers stored within the program stacks and fetches a copy of the program stack item referenced by the pointer from main memory and loads the copy into a microprocessor die; an interrupt bus that halts the loading process when an alert to a program jump or change to a global variable is registered and sends a memory management variable to a look-up table; a look-up table that redirects the controller to a new program stack following a program jump before it reinitiates the loading process; and a look-up table that fetches and stores the change to a global variable at its primary location in main memory before it reinitiates the loading process, wherein program stacks are mapped directly to physical memory and operated upon in real-time without the creation of a virtual copy of any portion of a program stack that is subsequently stored and processed by the desired processor using a minimal number of fetch/store commands and operational cycles.

The global variable interrupt look-up table may be maintained in physical memory or in cache memory. The program jump look-up table may be maintained in physical memory or in cache memory. The memory bank may manage all stack-based and heap-based memory functionality for the microprocessor die and other semiconductor die serving logical processes.

The general purpose computational operating system may further comprise a plurality of semiconductor die mounted upon it that provide CPU, GPU, field programmability, main memory control/arbitration, application-specific, bus management, or analog-to-digital and/or digital-to-analog functionality. Any or all of the microprocessor die may dedicate ≤45% of their transistor circuitry to servicing "fetch"/"store" code instructions. Any or all of the microprocessor die may dedicate ≤25% of their transistor circuitry is dedicated to "fetch"/"store" code instructions. The CPU die comprise multiple processing cores. The GPU die may comprise multiple processing cores. The CPU and GPU die may comprise multiple processing cores.

The global variable interrupt look-up table may be maintained in physical memory or in cache memory. The program jump look-up table may be maintained in physical memory or in cache memory. The memory bank may comprise static dynamic random-access memory (SDRAM). The memory bank may manages all stack-based and heap-based memory functionality for the microprocessor die and other semiconductor die serving logical processes.

The chip carrier substrate may be a semiconductor. Active circuitry may be embedded in the chip carrier substrate. The active circuitry embedded within the semiconductor substrate may manage USB, audio, video and other communications bus interface protocols. The microprocessor die's cache memory may be less than 16 mega-bytes per processor core or less than 128 kilo-bytes per processor core. The computing module may comprise a plurality of microprocessor die function as a distributed computing or fault tolerant computing system.

The operating system may include an additional fully integrated power management module that is frequency off-stepped in from the fully integrated power module to supply power to circuit elements at a slower switching speed. The frequency off-stepped additional fully integrated power management module may power a baseband processor. The fully integrated power management module may be mounted on the semiconductor chip carrier or may be formed on the semiconductor chip carrier. The fully integrated power management module may contain a resonant gate transistor that switches power at speeds greater than 250 MHz or at speeds in the range of 600 MHz to 60 GHz.

The program stacks may be sequenced into sub-divisions and loaded in parallel into multiple processor cores. An alert signaling a change to a global variable embedded within any program stack sub-division may halt the program stack loading process to all processor cores through the interrupt bus until the global variable is updated at its primary location in main memory and the global variable look-up tables reinitiates the loading process to all processor cores. The look-up table that manages global variable updates may be located in main memory. The look-up table that manages program jumps may be located in main memory. Heap-based memory functionality may be located entirely in main memory. Heap-based memory and stack-based memory functions may be managed directly from main memory. A global variable may be stored in lust one primary location in main memory. The primary location of a global variable may be in static dynamic random access memory (SDRAM), The general purpose computational operating system may be in thermal contact with a thermoelectric device. The general purpose computational operating system may further comprises an electro-optic interface. The general purpose computational operating system may have instruction sets are pipelined to a microprocessor die.

Still another embodiment of the present invention provides a general purpose stack machine computing module having an operating system, the computing module comprising: a hybrid computer module, comprising: a semiconductor chip carrier having electrical traces and passive component networks monolithically formed on the surface of a carrier substrate to maintain and manage electrical signal communications between: an application-specific integrated circuit (ASIC) processor die mounted on the chip carrier that is designed with machine code that matches and supports a structured programming language so it functions as the general purpose stack machine processor; a main memory bank consisting of at least one discrete memory die mounted on the semiconductor chip carrier adjacent to the ASIC processor die; a fully integrated power management module having a resonant gate transistor embedded within it that synchronously transfers data from main memory to the ASIC processor die at the processor clock speed; a memory management architecture and operating system that compiles program stacks as a collection of pointers to the addresses where elemental code blocks are stored at a primary location in main memory; a memory controller that sequentially references the pointers stored within the program stacks and fetches a copy of the item referenced by the pointer in the program stack from main memory and loads the copy into a microprocessor die; an interrupt bus that halts the loading process when an alert to a program jump or change to a global variable is registered and sends a memory management variable to a look-up table; a look-up table that redirects the controller to a new program stack following a program jump before it reinitiates the loading process; a look-up table that fetches and stores the change to a global variable at its primary location in main memory before it reinitiates the loading process; wherein, the stack machine computing module's memory management architecture and operating system organizes all of the operands used in a desired computational process as a sequenced linear collection within a first program stack, and, additionally compiles primitive elements of a complex algorithm as a sequenced linear collection that acts as a controlled list of operators within a second program stack, and then, loads the first and second program stacks into the ASIC die in a precise manner that applies the controlled list of operators in the second program stack to the sequenced linear collection of operands to execute the complex algorithm using a minimal number of instruction sets and operational cycles.

The program stacks may be mapped directly to physical memory and operated upon in real-time without the creation of a virtual copy of any portion of a program stack that is subsequently stored and processed by the desired processor.

The ASIC processor die may utilize a machine code wherein the operators operate upon the operands using post-fix notation. The general purpose stack machine computing module may be adapted to manage program jumps operating within iterative code using a minimal number of fetch/store commands and operational cycles.

The program stacks may be organized as a Last-in-First-Out ("LIFO") structure. The program stacks may be organized as a First-in-First-Out ("FIFO") structure. The ASIC processor die may utilizes a machine code that supports the FORTH programing language. The ASIC processor die may utilize a machine code that supports the POSTSCRIPT programming language. The ASIC processor die may utilize a machine code wherein the operators operate upon the operands using post-fix notation. The operating system may manages program jumps operating within iterative code using a minimal number of fetch/store commands and operational cycles. The operating system may update changes to a global variable buried within nested functions and recursive functions using a minimal number of fetch/store commands and operational cycles. The ASIC processor die may be a field programmable gate array ("FPGA"). The ASIC processor die may comprise multiple processing cores.

The general purpose stack machine computing module and operating system may further comprise CPU or CPU processors, an I/O system interface, a data bus, a status interrupt bus, a master controller and instruction set register, a logical interrupt register, and a global variable interrupt register. The CPU or CPU processors may comprise multiple processor cores. The main memory bank may subdivided to allocate tasks to multiple memory groups comprising a stack memory group, a CPU/GPU memory group, a global memory group, a redundant memory group, and a general utility memory group. Each of the multiple memory groups may comprise a memory address register/look-up table and program counter to administer allocated program blocks. The global memory group may store global variables, master instruction sets, and a master program counter and interfaces with the computing module's master processor. The global memory group may interface with other computing systems through the I/O system interface with other computer systems. The hybrid computer module may comprise a plurality of general purpose stack machine computing systems, each functioning as distributed computing systems. The hybrid computer module may contain a plurality of general purpose stack machine computing systems, each functioning as a fault-tolerant computing system.

The fully integrated power management module may contain a resonant gate transistor that switches power by modulating currents greater 0.005 A at speeds greater than 250 MHz or at speeds in the range of 600 MHz to 60 GHz. The global variable interrupt look-up table may be maintained in physical memory. The global variable interrupt look-up table may be maintained in the cache memory of the stack machine processor. The program jump look-up table may be maintained in physical memory. The program jump look-up table may be maintained in cache memory of the stack machine processor. The memory bank may comprise static dynamic random-access memory (SDRAM). All global variables and code elements may be stored at a primary location in static memory. The memory bank may manage all stack-based and heap based memory functionality for the microprocessor die and other semiconductor die serving logical processes. The program stacks may be sequenced into sub-divisions and loaded in parallel into multiple processor cores. The program stacks may be sequenced into sub-divisions and loaded in parallel into multiple processor cores.

An alert signaling a change to a global variable embedded within any program stack sub-division may halt the program stack loading process to all processor cores through the interrupt bus until the global variable is updated at its primary location in main memory and the global variable look-up tables reinitiates the loading process to all processor cores. The fully integrated power management module may have a resonant gate transistor embedded within it that transfers data from main memory to the ASIC at speeds that range from the processor clock speed to $\frac{1}{10}^{th}$ the processor clock speed. The memory bank may provide memory controller functionality that arbitrates memory management issues and protocols with processor die in which it is in electrical communication.

An even further embodiment of the present invention provides a general purpose stack processor for use in a general purpose stack machine module, wherein the general purpose stack processor comprises: an arithmetic logic unit (ALU), an ALU operand buffer, a stack buffer utility, a top-of-the-stack (TOS) buffer, an instruction set utility, and a stack processor program counter, that, exchanges data in real-time with a stack memory group located in within main memory through a data bus that is part of a hybrid computing module, wherein the stack memory group further comprises: a data stack register, a return register, an internal stack memory program counter, and one or more instruction stack registers; and, will halt the data exchange when an alert to a change to global variable is received from the interrupt register or signaled by the stack processor program counter through the interrupt bus.

The general purpose stack processor may further comprise a machine code that matches and supports a structured language. The structured language ma be the FORTH programming language. The instruction stack register may comprise a sequenced list of pointers to the physical addresses within the ALU that represent machine-coded logical operations that match a specific primitive element operation. A program jump registered by the stack processor program counter halts data traffic on the data bus until the stack utility buffer redirected to start loaded the high priority program blocks into the data stack, the return stack, and instruction registers.

The data stack register may comprises a sequenced collection of operands. The data stack register may comprise a stack of pointers to the physical address in main memory that serves as an operand's primary location. The operands in the data stack register may be sequentially loaded into the stack buffer utility. A memory controller may use the pointers to load a copy of the associated data item into the stack buffer utility directly from its primary location in main memory. The stack buffer utility may load the data item in or mapped to the very first item transferred from the data stack register into the TOS buffer on the second operational cycle, while it simultaneously loads the second item transferred from the data stack register into the ALU operand buffer. The instruction stack register(s) may comprise a sequenced list of primitive element operators. The instruction stack register(s) may comprise a sequenced list of pointers to the physical addresses within the ALU that represent machine-coded logical operations that match a specific primitive element operation. The instruction set utility may simultaneously load operands stored in the TOS buffer and the ALU operand buffer into the ALU which applies the associated operator to the loaded operands and returns the resultant to the TOS buffer while the stack buffer utility loads the next operand into the ALU operand buffer and the instruction set utility fetches the next primitive element operator from the sequenced list in the instruction stack register. The instruction set utility may be configured to record and copy a fixed number of operand pairs and corresponding operators. The fixed number of operands and corresponding operators may be programmable. The instruction set utility may be configured to re-run the fixed number of operand pairs and corresponding operators following a global variable update.

The alert signaled by the stack processor program counter or from global variable register may halt all traffic over the data bus until the global variable is updated. The global variable may only be updated at the physical address to its primary location in main memory because all data stack registers comprise pointers the physical address where the actual code elements are stored.

A program jump registered by the stack processor program counter may halt data traffic on the data bus until the stack utility buffer redirected to start loaded the high priority program blocks into the data stack, the return stack, and instruction registers. The return stack may comprise a list of addresses that are used to permanently store a block of instructional code completed by the stack processor. The general purpose stack processor may comprise multiple general purpose stack processing cores. Main memory may comprises static dynamic random-access memory. The stack processor may communicate I/O system interface through the data bus. Instruction sets may be pipelined to the general purpose stack processor through the one or more instruction set registers.

BRIEF DESCRIPTION OF THE DRAWINGS

The present invention is illustratively shown and described in reference to the accompanying drawings, in which:

FIGS. 1A, 1B, 1C depict the scaled surface areas distributed to cache memory and processor functions in modern microprocessor systems.

FIGS. 2A, 2B depict the higher design and lithography costs of advanced semiconductor technology nodes and their impact on the cost SoC systems as a function of varying market volumes.

FIGS. 4A, 4B illustrate multi-core microprocessor die with reduced cache memory used in the hybrid computing module.

FIGS. 5A, 5B, 5C depict the use of semiconductor layers that form 3-D electron gases.

FIG. 6 illustrates the use of a thermoelectric device in the hybrid computing module.

FIGS. 7A, 7B, 7C, 7D, 7E, 7F illustrate the invention's methods and embodiments that enable minimal instruction set computing suitable for general purpose applications.

FIGS. 8A, 8B depict the prior art related to stack machines.

FIGS. 9A, 9B illustrate characteristic features of a general purpose stack machine enabled by this invention.

DESCRIPTION OF THE PREFERRED EMBODIMENT

Figure 3A:
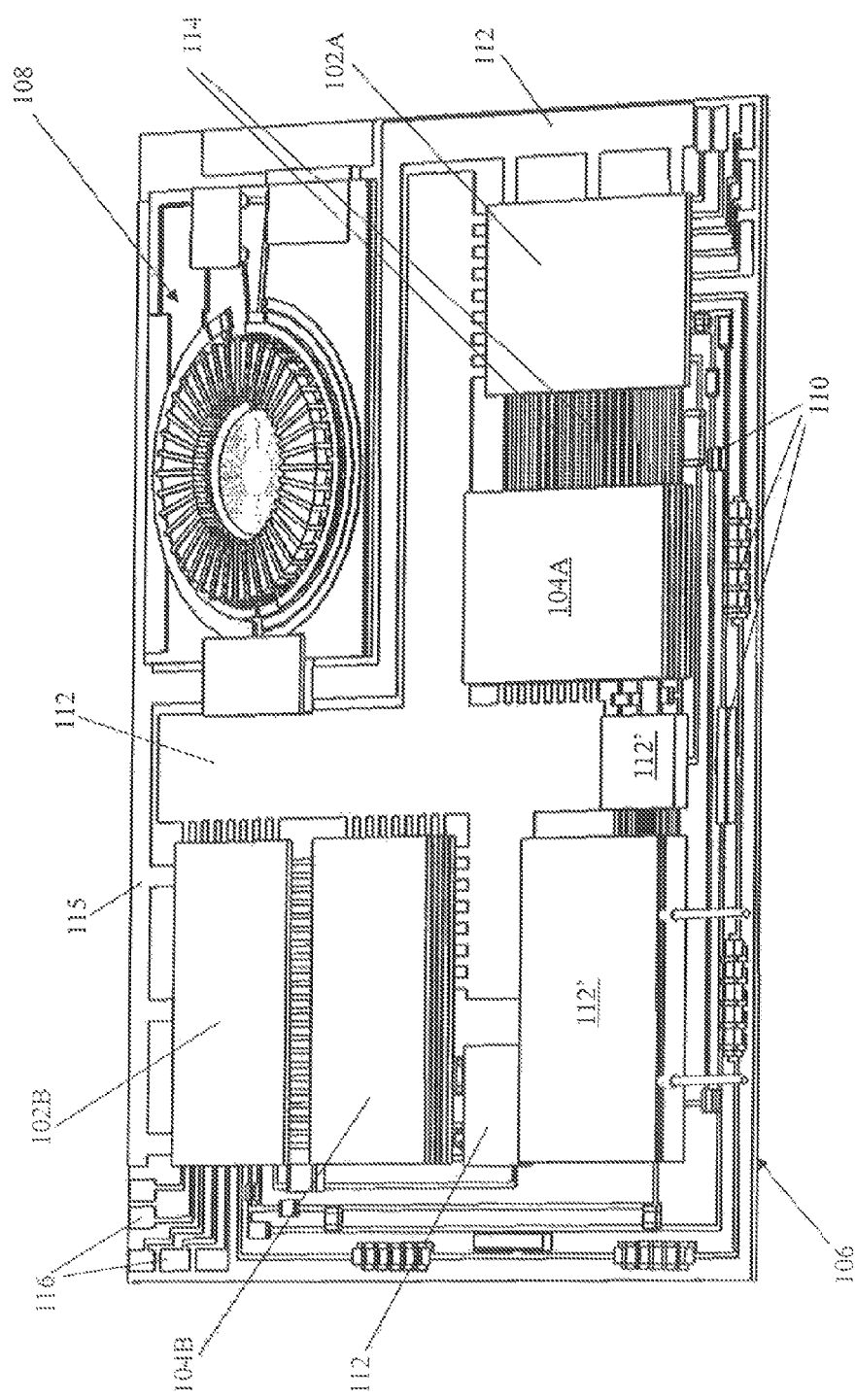
FIGS. 3A, 3B depict the hybrid computing module.
Figure 3B:
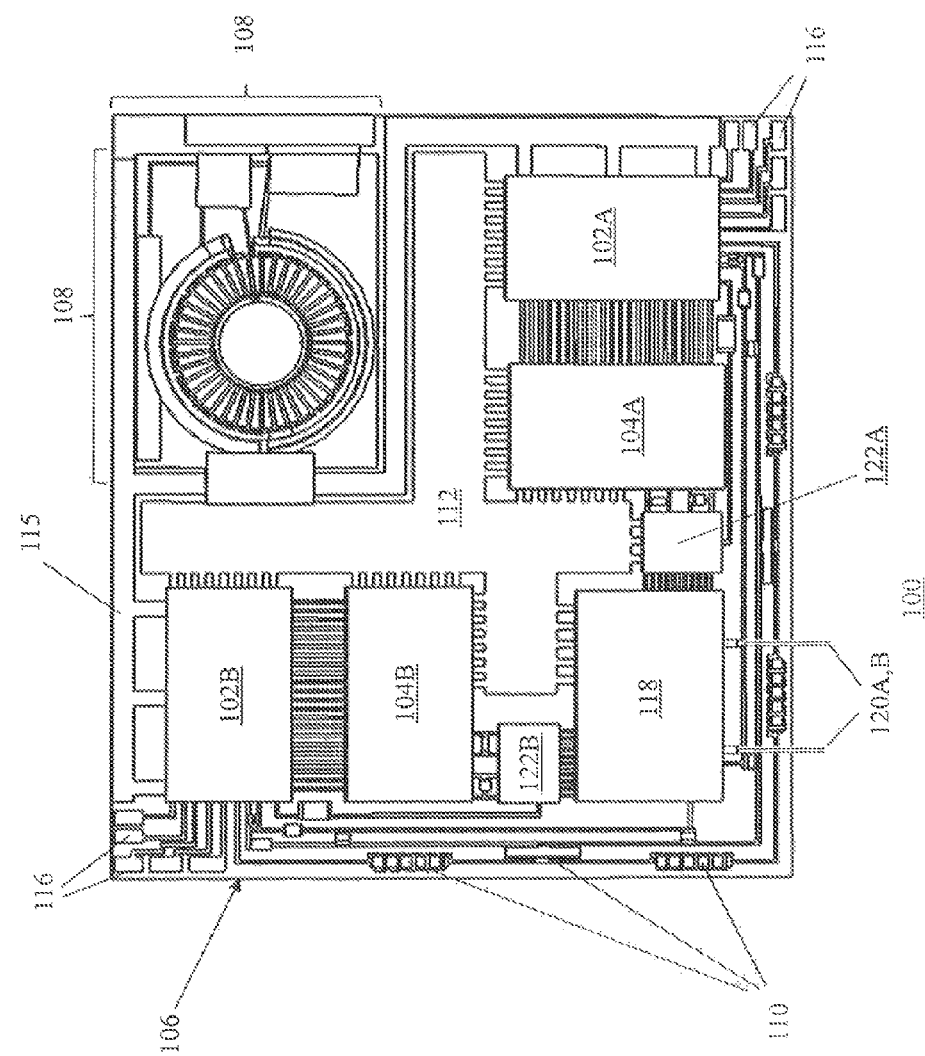

The present invention is illustratively described above in reference to the disclosed embodiments. Various modifications and changes may be made to the disclosed embodiments by persons skilled in the art without departing from the scope of the present invention as defined in the appended claims.

This application incorporates by reference all matter contained in de Rochemont U.S. Pat. No. 7,405,698 entitled "CERAMIC ANTENNA MODULE AND METHODS OF MANUFACTURE THEREOF" (the '698 application), de Rochemont U.S. Ser. No. 11/479,159, filed Jun. 30, 2006, entitled "ELECTRICAL COMPONENT AND METHOD OF MANUFACTURE" (the '159 application), U.S. Ser. No. 11/620,042 (the '042 application), filed Jan. 6, 2007 entitled "POWER MANAGEMENT MODULES", de Rochemont and Kovacs, "LIQUID CHEMICAL DEPOSITION PROCESS APPARATUS AND EMBODIMENTS", U.S. Ser. No. 12/843,112, ('112), de Rochemont, "MONOLITHIC DC/DC POWER MANAGEMENT MODULE WITH SURFACE FET", U.S. Ser. No. 13/152,222 ('222), de Rochemont, "SEMICONDUCTOR CARRIER WITH VERTICAL POWER FET MODULE", U.S. Ser. No. 13/168,922 ('922A), de Rochemont "CUTTING TOOL AND METHOD OF MANUFACTURE", U.S. Ser. No. 13/182,405, ('405), "POWER FET WITH A RESONANT TRANSISTOR GATE", U.S. Ser. No. 13/216,192 ('192), de Rochemont, "SEMICONDUCTOR CHIP CARRIERS WITH MONOLITHICALLY INTEGRATED QUANTUM DOT DEVICES AND METHOD OF MANUFACTURE THEREOF", U.S. Ser. No. 13/288,922 ('922B), and, de Rochemont, "FULLY INTEGRATED THERMOELECTRIC DEVICES AND THEIR APPLICATION TO AEROSPACE DE-ICING SYSTEMS", U.S. Application No. 61/529,302 ('302).

The '698 application instructs on methods and embodiments that provide meta-material dielectrics that have dielectric inclusion(s) with performance values that remain stable as a function of operating temperature. This is achieved by controlling the dielectric inclusion(s) microstructure to nanoscale dimensions less than or equal to 50 nm. de Rochemont '159 and '042 instruct the integration of passive components that hold performance values that remain stable with temperature in printed circuit boards, semiconductor chip packages, wafer-scale SoC die, and power management systems. de Rochemont '159 instructs on how LCD is applied to form passive filtering networks and quarter wave transformers in radio frequency or wireless applications that are integrated into a printed circuit hoard, ceramic package, or semiconductor component. de Rochemont '042 instructs methods to form an adaptive inductor coil that can be integrated into a printed circuit board, ceramic package, or semiconductor device. de Rochemont et at. '112 discloses the liquid chemical deposition (LCD) process and apparatus used to produce macroscopically large compositionally complex materials, that consist of a theoretically dense network of polycrystalline microstructures comprising uniformly distributed grains with maximum dimensions less than 50 nm. Complex materials are defined to include semiconductors, metals or super alloys, and metal oxide ceramics. de Rochemont '222 and '922A instruct on methods and embodiments related to a fully integrated low EMI, high power density inductor coil and/or high power density power management module. de Rochemont '192 instructs on methods to integrate a field effect transistor that switch arbitrarily large currents at arbitrarily high speeds with minimal On.-resistance into a fully integrated silicon chip carrier. de Rochemont '922B instructs methods and embodiments to integrated semiconductor layers that produce a 3-dimensional electron gas within semiconductor chip carriers and monolithically integrated microelectronic modules. de Rochemont '302 instructs methods and embodiments to optimize thermoelectric device performance by integrating chemically complex semiconductor material having nanoscale microstructure.

Reference is now made to FIGS. 3-6 to illustrate various embodiments and means pertaining to the present invention. A hybrid system-on-chip ("SoC") computing module 100 is shown in a perspective view in FIG. 3A and a top view in FIG. 3B. The hybrid computing module 100 is formed by mounting at least one microprocessor die 102A,B with at least one memory bank 104A,B on a semiconductor chip carrier 106. The semiconductor chip carrier 106 consists of a substrate, preferably a semiconducting substrate, upon which electrically conducting, traces and passive circuit network filtering elements have been formed, and a plurality of semiconductor die and circuit modules have been mounted or monolithically integrated. Although a semiconducting substrate is preferred because it enables the further integration of active circuitry within the semiconductor chip carrier's 106 base support structure, the substrate may alternatively comprise an electrically insulting material that has high thermal conductivity such as MAX-phase materials referenced in de Rochemont '405, which enable substrate materials that having electrical resistivity greater than $10^{10}$ ohm-cm and thermal conductivity greater than 100 $W\text{-}m^{-1}\text{-}K^{-1}$.

The at least one microprocessor die 102A,B is preferably a multi-core processor, which may be assigned logic, graphic, central processing, or math functions. The at least one memory bank 104A,B is preferably configured as a stack of memory die and may be a Hybrid Memory Cube™ currently under development. The memory bank 104A,B may optionally comprise an integrated circuit within the stack that provides memory controller functionality that arbitrates management issues and protocols with the microprocessor die 102A,B. The controller chip stacked within the memory bank 104A,B may comprise a field programmable gate array (FPGA), but is preferably a static address memory controller. It may alternatively provide application-specific functionality that supports kernel management utilities unique to the low-volume, or mid-volume application for which the hybrid computing module 100 was designed, which improves computing performance over general purpose solutions. Various embodiments of the semiconductor chip carrier 106 useful to the present applications as well as methods of their construction are described in greater detail in de Rochemont '222, '922A, '192, which are incorporated herein by reference. For the purposes of illustrating this invention, the semiconductor chip carrier 106 consists of a power management module 108 that is either mounted on to or monolithically integrated into the semiconductor chip carrier 106, passive circuit networks 110 as needed to properly regulate the power bus 112 and interconnect bus 114 networks, ground planes 115, input/output pads 116, and timing circuitry that arc fully integrated on to the semiconductor chip carrier using LCD methods described in de Rochemont and Kovacs '112 and de Rochemont '159. The semiconductor chip carrier 106 may additionally comprise standard bus functionality (not shown for clarity) in the form of circuitry that is integrated within its body to manage processing buffers, audio, video, parallel bus or universal serial bus (USB) functionality. The power management module 108 incorporates a resonant gate power transistor configured to reduce loss within the power management module 108 to levels less than 2% and to switch power regulating currents greater than 0.005 A at speeds greater than 250 MHz, preferably at speeds in the range of 600 MHz to 60 GHz, that can be tuned to match or support clock speed(s) of the microprocessor die 102A,B, or transfer data from main memory at to the processor die at speeds that range from the processor clock speed to $\frac{1}{10}^{th}$ the processor clock speed using methods and means instructed in de Rochemont '922A and '192. Although FIGS. 3A,3B only depict a single power management module for convenience, a plurality of power management modules 108 may be integrated into the semiconductor chip carrier 106 as may be needed to serve a particular design objective for the hybrid computing module 100. For instance, digital radio systems incorporate baseband-processors to manage radio control functions (signal modulation, encoding/decoding, radio frequency shifting, etc.). Baseband processors manage lower frequency processes, but are often separated from the main CPU because they are highly dependent on timing and require certification of their software stack by government regulatory bodies. Although the current invention enables the real-time processing needed to integrate the baseband processors with the CPU, (see "stack-based computing" below), it might be advantageous to mount a certified baseband processor (102B) separately from the main CPU (102A) to avoid system certification delays. In this instance, the design might also include an additional "off-stepped" power management module (not shown) that regulates power at lower switching speeds that are in-step with the baseband processing unit.

The hybrid computing module may also comprise one or more electro-optic signal drivers 118 that interface the module to within a larger computing or communications system by means of an optical waveguide or fiber-optic network through input/output ports 120A,120B. Additionally, the hybrid computing module may also comprise application-specific integrated circuitry (ASIC) semiconductor die 122 that coordinate interactions between microprocessor die 102A,B and memory banks 104A,B. Although the ASIC semiconductor die 122 may have specific processor functions described below, it can also be used to customize memory management protocols to achieve improved coherency in low-volume to mid-volume applications, or to serve a specific functional need, such as radio signal modulation/de-modulation, or to respond to specific data/sensory inputs for which the computing module 100 was uniquely designed. Multiple cost, performance, foot print and power management benefits are enabled as a result of the module configuration defined by this invention.

Figure 4B:
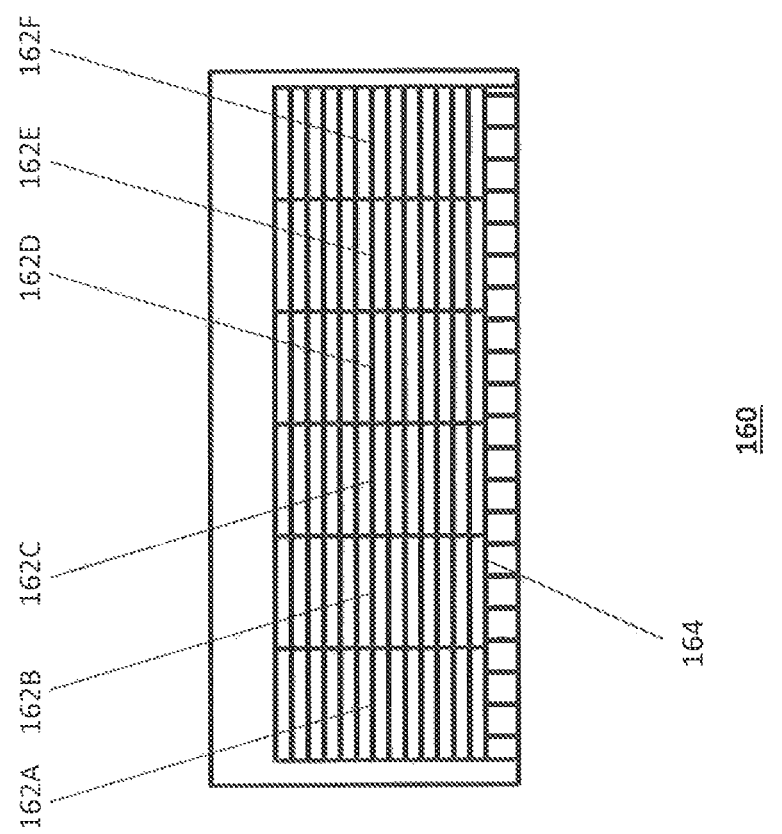

The high efficiency (98+%) of the low-loss power management module 108 allows it to be placed in close proximity to the microprocessor die 102A,B and memory banks 104A,B. This ability to integrate low loss passive components operating at critical performance tolerances with active elements embedded within the semiconductor chip carrier 106, or within semiconductor layers deposited thereupon, is used to resolve many of the technical constraints outlined above that lead to on-chip and off-chip data bottlenecks that compromise system performance in system-on-chip ("SoC") product offerings. The efficient switching of large currents at speeds that match the processor clock(s) are achieved by integrating a resonant gate transistor into the monolithically integrated power management module 108 using the means and methods described in de Rochemont '922A and '192. The resonant response of the resonant gate transistor modulating the power management module's power FET is tuned to match core clock speeds in the microprocessor die 102A,B. Designing the power management module to synchronously match off-chip memory latency and bandwidth to the needs of computing system cores allows data from physical memory banks 104A,B to be efficiently transferred to and from processor cores, thereby mitigating the need for large on-chip cache memory in the microprocessor die 102A,B. Although prior reference is made to x86 microprocessor core architecture to establish visual clarity in FIGS. 1A,1B,1C, the generic value of this invention applies to computing systems of any known or unknown 32-bit, 64-bit, 128-bit (or larger) microprocessor architecture. Therefore, a preferred embodiment of the hybrid computer module multi-core processors 150/160 (102A,B) that have less than 15%, preferably less than 10% of their surface areas allocated to cache memory 152/160 as shown in FIGS. 4A,4B. Multi-core processor die 150 that minimize the fractional percentage of semiconductor surface area allocated to cache memory 152A,152B,152C,152D/162A,162B,162C,162D,162E,162F and maximize real estate dedicated to processor core 154 functionality have smaller footprint, resulting in higher productivity yields and lower production costs. The use of microprocessor die 150 wherein the ratio of processor cores 154 to cache memory 152 functionality is greater than 90% increases computing performance by more than 30%-50% per square millimeter (mm$^2$) of processor integrated circuitry. Reduced cache memory 152 requirements within the processor die 150 (102A, B) boost productivity yields per wafer, which lowers chip and system costs to the hybrid computing module 100.

FIG. 4A illustrates the relative size of a scaled representation of a Nehalem quad-core microprocessor chip 150 fabricated using the 45 nm technology node if it were designed to have 10% of its surface area allocated to cache memory for comparison with FIG. 1A. The chip's surface area is allocated for 4 microprocessor cores 152A,152B, 152C,152D, and shared L3 cache memory 164 that has been reduced in size. In this instance, the L3 cache memory 164 occupies roughly 10% of the surface area not allocated to system interconnect circuits. Similarly, FIG. 4B illustrates a modified Westmere-EP 6 core microprocessor chip 160 fabricated using the 32 nm technology node that allocates less than 10% of its available surface area to L3 cache memory 164 to serve its 6 microprocessor cores 162A,162B, 162C,162D,162E,162F for comparison with FIG. 1C. The smaller size of the processor die's cache memory directly reflects smaller cache memory capacity. Therefore an alternative embodiment of the invention claims a computing system comprising a hybrid computing module 100 consisting of processor functionality 102A,B and physical memory utility (memory banks) 104A,B that is segregated onto discrete semiconductor die mounted upon a monolithically integrated semiconductor chip carrier 106, wherein the processor die 102A,B have on-board cache memory capacities less than 16 Mb/core, preferably less than 128 Kb/core.

A subsequent embodiment of the invention enabled by mounting microprocessor die 102A,B and memory banks 104A,B upon a semiconductor chip carrier 106 comprising a monolithically integrated, high-speed power management module 108 that synchronously switches power at processor clock speeds provides real-time memory access by removing the need for direct-memory access updates from cache memory. In this configuration of the hybrid computing module 100, main memory resources located in memory banks 104A,B serve all stack-based and heap-based memory functionality for microprocessor die 102A,B. The microprocessor die 102A, B may be organized as distributed computing cells or serve as a fault-tolerant computing platform.

An additional embodiment of the hybrid computer module 100 further reduces cost through the use of ASIC semiconductor die 122A, 122B to customize the performance of general purpose microprocessor systems for broader application to low- and mid-volume market sectors. As illustrated in FIGS. 2A, 2B, the higher design and masking costs of the more advanced technology nodes (45 nm & 32 nm) causes SoC semiconductor die to be more expensive in low-volume 20 and mid-volume 22 market segments. An SoC device will integrate a plurality of functions into a single die. Therefore, fully integrated system-on-chip device fabricated at the 45 nm or 32 nm technology nodes for low-volume 20 and mid-volume 22 applications will be more than—2-3× more expensive than the same device fabricated at the 90 nm node after the normalized cost per function is figured into the total cost. SoC cost savings only achieve greater than marginal benefit at the 32 nm node and beyond in large volume markets 24. Historically, low-volume and mid-volume applications comprise the majority of market applications in the aggregate. As a result of these trends, the more advanced technology nodes (32 nm and beyond) will ultimately impose higher or unacceptable costs upon applications serving the larger aggregate market or force those applications to be unserved. Most system applications need to customize performance by optimizing memory management functions to a specific application. Therefore, it is a specific embodiment of the hybrid computing module 100 to incorporate general purpose microprocessor die 102A,B and memory banks 104A,B fabricated to the highest technology node and use ASIC semiconductor die 122A,122B to tailor functions for a specific application. Semiconductor die adjacent to the microprocessor die 102A, 102B may provide any functional process to the hybrid computing module, including analog-to-digital or digital-to-analog functionality. Functionality provided by the ASIC semiconductor die 122A, 122B (or other die) and bus management circuitry embedded within the semiconductor chip carrier 106 may be fabricated using a lower technology whenever it is possible to do so.

As shown in FIGS. 5A, 5B, 5C, a further embodiment of the hybrid computing module 100 uses methods described in de Rochemont '192, incorporated herein by reference, to integrate a semiconductor layer 130,132, 134 that forms a 3D electron gas to maximize switching speeds of active components embedded within the semiconductor chip carrier 106, the power management module 108, or the electro-optic driver 118, respectively, to further improve switching speeds within those devices.

An additional embodiment of invention, (see FIG. 6), utilizes a thermoelectric module 140 in thermal communication with the unpopulated major surface 142 of the semiconductor chip carrier 106 to pump heat generated by the active components mounted on or integrated into the chin carrier 106 to a thermal reservoir 144. A preferred embodiment of the thermoelectric module 140 utilizes methods and means described by de Rochemont '302, incorporated herein by reference, to integrate the thermoelectric module 140 into the hybrid computing module 100. Thermoelectric modules may also be mounted onto a free surface of various semiconductor mounted onto the semiconductor chip carrier 106.

As described in the Background to the Invention above, larger cache memories on multi-core processor die have been required due to an inability to supply sufficient levels of power pulsed at high enough clock speeds to efficiently transfer data from physical memory to the processor cores. This has resulted in problems with latency and memory coherence in SoC computing and processor designs. Without the larger cache memories underutilized multi-core processors clock "zeros" waiting for the data to be input to the system.

Pulsed power is required to access (read or write) and to refresh data stored within arrays of physical and cache memory. Larger memory banks require larger currents to strobe and transfer data from physical memory to the processor cores. Large latency, driven by the inability of alternative power management solutions to pulse sufficiently large currents at duty cycles close to processor core clock speeds have necessitated the move to integrate larger cache memory 4,7,10 on conventional multi-core processor die 1,6,9 (see FIGS. 1A,1B,1C). The larger cache memories mask the data transfer deficiencies and mitigate associated problems with memory coherence in computing platforms. These problems are resolved by improving the speed and efficiency of power management modules supplying the computing platform and providing means to maintain signal integrity within passive circuit and interconnect networks used to route high-speed digital signals within the system.

Latency in asynchronous dynamic random access memory (DRAM) remains constant, so the time delay between presenting a column address and receiving the data on the output pins is fixed by the internal configuration of the DRAM array. Synchronous DRAM (SDRAM) modules organize plurality of DRAM arrays in a single module. The column address strobe (CAS) latency in SDRAM modules is dependent upon the clock rate and is specified in clock ticks instead of real time. Therefore, computing systems that reduce latency in SDRAM modules by enabling large currents to be strobed at gigahertz clock speeds improve overall system performance through efficient, high-speed data transfers between physical memory and the processor cores. An embodiment of hybrid computing module 100 designs the power management 108 to regulate currents greater than 50 A, preferably greater than 100 A. As is known to engineers skilled in the art of high-power circuits, care needs to be taken in laying out metallization patterns in passive circuit networks 110, power bus 112, interconnect bus 114, and ground planes 115 to minimize problems associated with electromigration in conducting elements integrated within the module.

The hybrid computing module 100 situates the memory banks 104A,B in close proximity to the microprocessor cores 102A,B to reduce delay times and minimize deleterious noise influences. Tight tolerance passive elements enabled by LCD manufacturing methods integrated into the passive circuit networks 110 are used to improve signal integrity and control leakage currents by maintaining stable transmission line and filtering characteristics over standard operating temperatures. Methods that minimize loss in the magnetic cores of inductor and transformer components described in de Rochemont '222, incorporated herein by reference, are used to maximize the efficiency and signal integrity of passive circuit networks 110 and power management modules 108. Large currents (≥50 A) regulated at microprocessor clock speeds by power management modules 108 operating at 98+% efficiencies supply the processor die 102A,B (150) and memory banks 104A,B to reduce latency while boosting core utilization rates above 50% even though on-chip cache memory is reduced in the processor die102A,B.

Matching off-chip memory latency and bandwidth to meet the needs of the computing systems' cores removes the need for large on-chip cache memories and improves coherence by maintaining all shared data in physical memory where it is simultaneously available to all processor cores. Removing on-chip memory constraints leads to roughly 35%-50% increase in performance per square millimeter ($mm^2$) of microprocessor real estate. A typical 6 core-Westmere-EP cpu 9 (see FIG. 1C) operating at voltages between 0.75 V and 1.35 V and a switching speed of 3.0 GHz consumes 95 Watts. The same cpu driven at 4.6 GHz (a 54% increase in switching frequency) will consume 45% more power due to a combination of higher voltage and larger switching currents, assuming leakage is tightly controlled. The system will consume 150 W of supplied power when it is supplied by a power management device that has a 92% conversion efficiency.

A hybrid computing module 100 comprising a high efficiency power management module 108 having a 98+% efficiency that is capable of driving large currents at switching speeds that match processor core clock speeds (2-50 GHz) improves performance and power consumption through superior conversion efficiencies and lower cpu operating voltages. A 9-core version of the same processor, reconfigured by eliminating on-chip L3 cache memory 10, would consume 45% more power when operated at 3.0 GHz while occupying roughly the same footprint as the 6-core Westmere-EP cpu 9. As a general rule, the hybrid computing module 100 provides a 2.3× (230%) increase in performance while decreasing CPU power consumption 17%, simply by eliminating power consumed in cache memory from the processor die. System-level performance comparisons are provided in Table I immediately below.

TABLE I

| Cores | Clock Speed (GHz) | Operating Voltage | Conversion Efficiency | Power Consumption |
| --- | --- | --- | --- | --- |
| 6 | 4.6 | 1.35 | 92% | 150 W |
| 6 | 4.6 | 0.75 | 98% | 84 W |
| 9 | 4.6 | 0.75 | 98% | 121 W |

It has long been a desired function to have real-time, low latency main memory updates generated by the processor die. This invention allows for such functionality that mitigates and greatly minimizes the need for cache-based heap memory, resulting in in smaller-sized processor dies when compared to conventional chip designs, it enables processor die cache memories that can be tasked primarily for stack-based resources. It is therefore another preferred embodiment of the invention to enable a direct memory access computing system wherein ≥50% of the cache memory, preferably 70% to 100% of the cache memory, is allocated to stack-based, rather than heap-based, memory functions. Therefore, a principal embodiment of the invention is a computing system wherein heap-based memory functionality (i.e. pointers which map cache memory to RAM) is removed entirely from cache memory and placed in main memory. A further embodiment of the invention provides for the management of stack-based and heap-based memory functions directly from physical or main memory. Additionally, changes in operational architectures would be possible due to synchronization between the system processor(s) and main memory. Further benefits include the removal of expensive control algorithms providing cache and memory coherency functionality as well as cache hit-miss prediction. Much flatter memory designs can be achieved removing the need for multiple layers of cache memory.

The improved computer architectures and operating systems enabled by the hybrid computer module 100 are depicted in FIGS. 7A-7F. Computing systems that utilize cache memory to achieve higher speed require a memory management architecture 200 that employs predictive algorithms 202 located in cache memory 204 to manage the flow of data and instruction sets in and out of cache memory 204. Memory coherence is maintained through invalidation-based or update-based arbitration protocols. The algorithms 202 reference a look-up table (register or directory) 206, which may be located in cache memory 204 or physical memory 208 that contains a list of pointers 210. The pointers reference addresses 212 where program stacks 214 comprising sequenced lists of data and process instructions that define a computational process are located in physical memory 206. When the processor core 215, calls a selected program stack 214, a copy of the called program stack 216 listing data and/or processes needed to serve a computational objective is then loaded into the cache memory for subsequent processing by the processor unit 215.

Conventional computing systems crash or freeze when the predictive algorithms 202 fail to properly estimate cache memory requirements of the called program stack 216. When this occurs, the copied data and/or processes in the called program stack 216 have a bit-load that overflows the bit-space available in cache memory. The subsequent "stack overflow" usually requires the entire system to be re-booted because it can no longer find the next steps in the desired computational process. Therefore, a higher efficiency computing platform that is invulnerable to cache memory stack overflows and does not require a predictive algorithm 202 or a cache memory 204 to complete complex or general purpose computations is highly desirable.

An additional deficiency of cache-based computing is the need to dedicate roughly 45% of the transistors in the processor 215 and 30%-70% of the code instructions to manage "fetch"/"store" routines used to maintain coherency when copying a stack and returning the computed result back to main memory to maintain coherency. Therefore, memory management architectures and computer operating systems that increase computational efficiencies by substantially reducing processor transistor counts and instruction sets are equally desirable for their ability to reduce processor size, cost, and power consumption while increasing computational speeds are highly desirable.

Figure 7A:
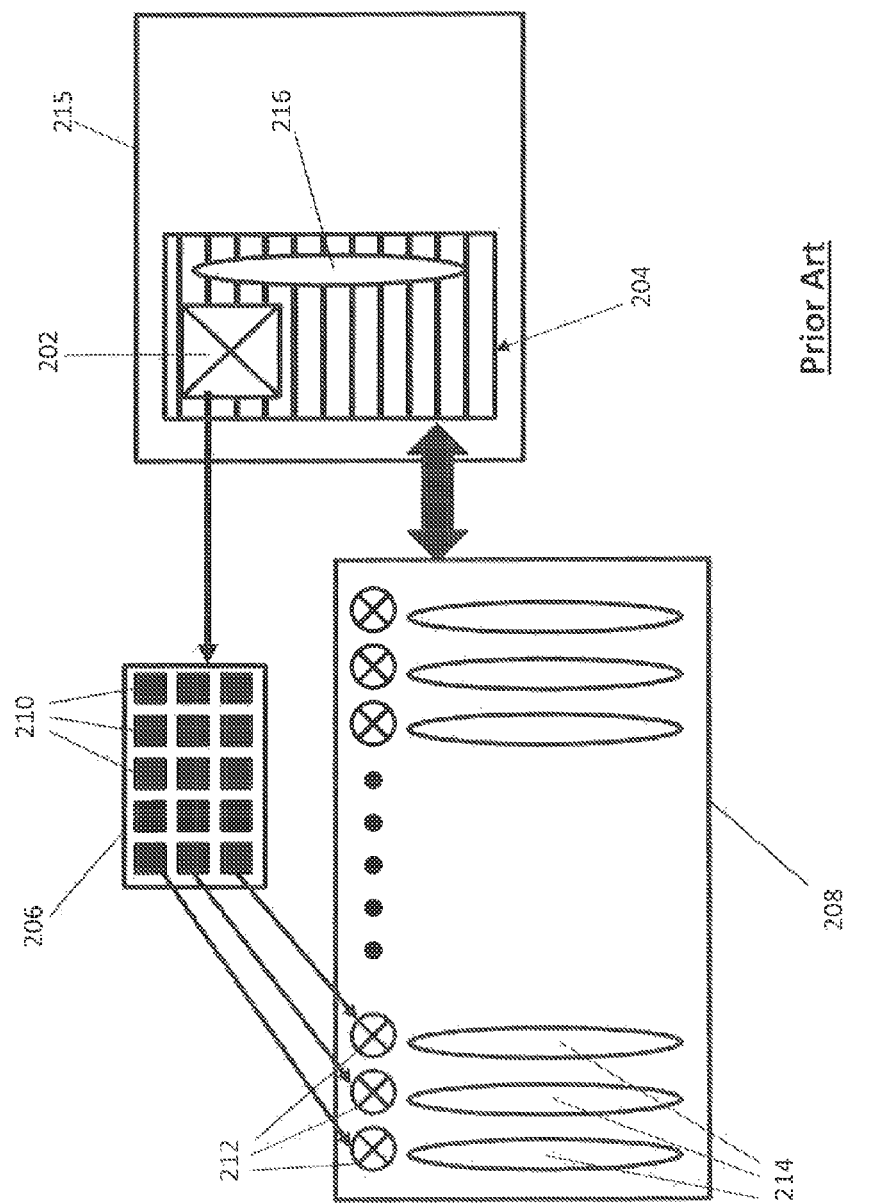
Figure 7B:
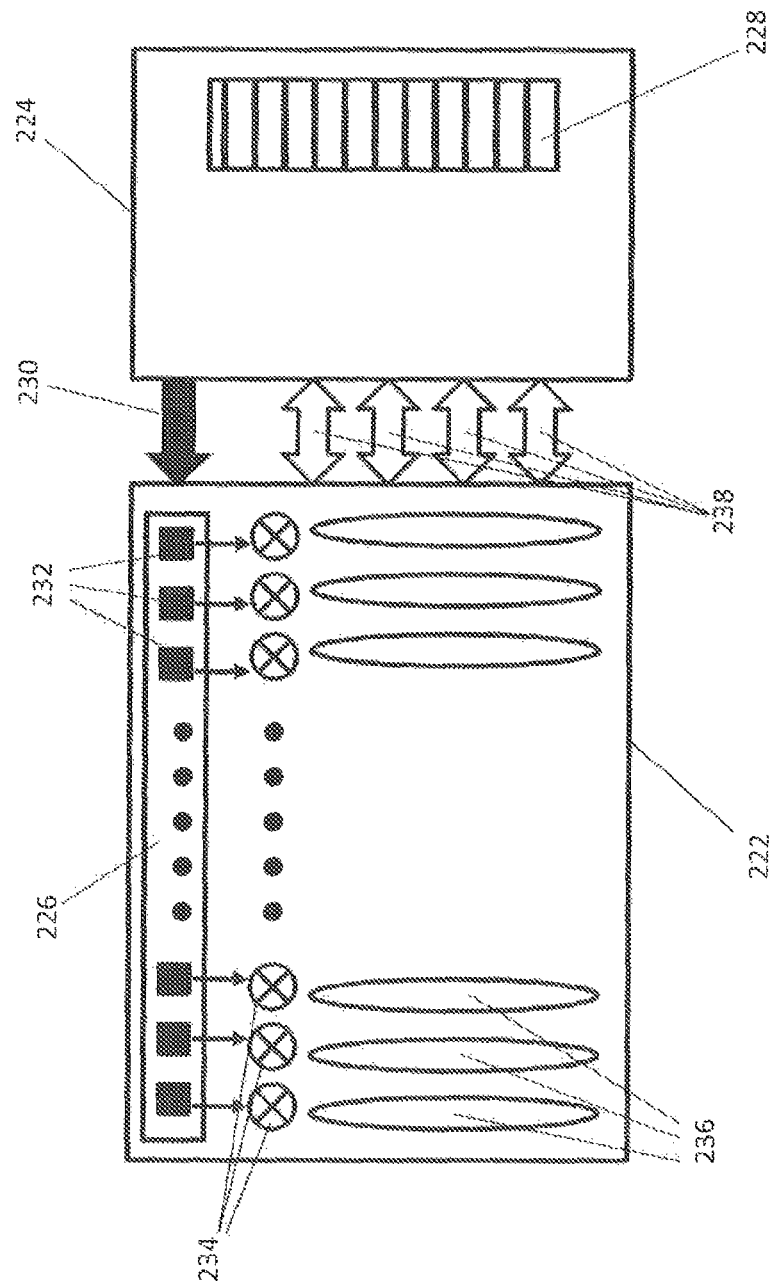

FIG. 7B depicts the memory management architecture 220 that is another preferred embodiment of the invention. This embodiment overcomes the stack overflow limitations of conventional computing architectures 200 and eliminates the need for complex predictive memory management algorithms 202 by running program stacks directly from main memory 222. The algorithms 202 are mitigated or eliminated in a hybrid computing module 100 when the resonant gate transistor in the fully integrated power management module 108 is tuned to switch power at speeds that enable the physical memory 222 to operate in-step with the clock speed of the processor unit 224. Although the look-up table 226 can be located in an optional cache memory 228 on-board the processor unit 224, it is a preferred embodiment of the invention to locate the look-up table 226 in physical memory 222. The invented architecture subsequently enables the processing unit 224 to render a memory management variable 230 to the look-up table 226 that selects the pointer 232 referencing the address 234 of the next set of data and/or processes in a program stack 236 needed by the processor unit 224 to complete its computational task. The availability of essentially unlimited bit-space in physical memory allows the variable 230 to instruct the look-up table 226 to reassign and reallocate addresses 234 to match the requirements of processed data and/or updated processes as they are loaded 238 in and out of the processing unit 224.

Figure 7C:
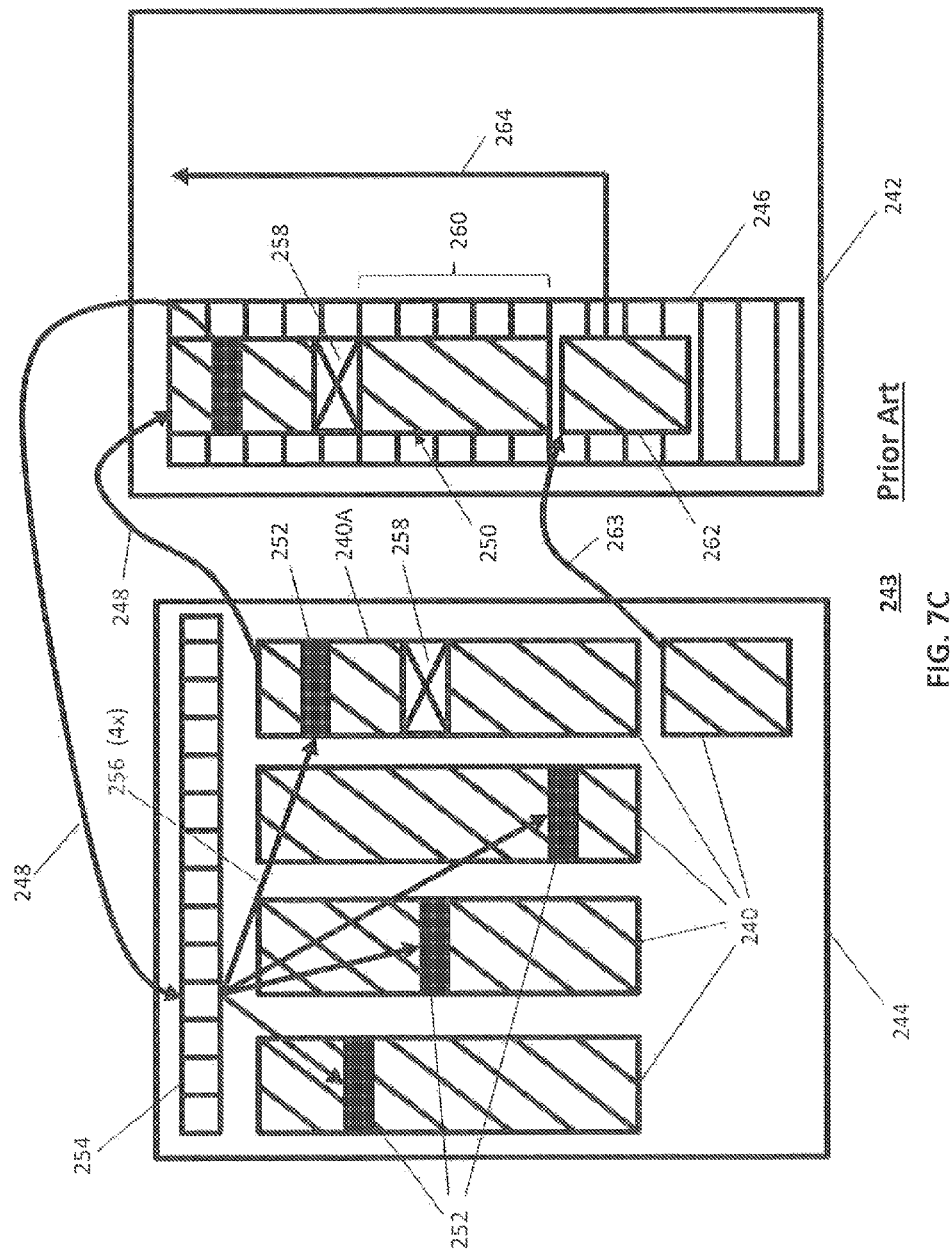

FIGS. 7C, 7D further illustrates the intrinsic benefits of a computer operating system enabled by the invention's memory management architecture 220 when it is applied to processing program stacks 240 through a single-threaded CPU processor 242. As illustrated in FIG. 7C, a modern general purpose operating systems 243 loads all declared program items comprising variables (global and local), data structures, and called functions, etc., (not shown in its entirety for clarity), contained within a program stack 240 directly from the computer's main memory 244 into the CPU cache memory 246. During the compiling process the operating system 239 copies these items and organizes them as sequenced code blocks into a collection of program stacks 240 that are collectively stored as heap memory within main memory 244. The operating system 243 organizes the items within the program stacks 240 stored in main memory 244 (or optionally loaded into cache memory 246) to be operated upon as a last-in-first-out ("LIFO") series of variables and instruction sets.

When called, a computational process defined within a first selected program stack 240A heaped in main memory 244 is copied and transferred 248 into the CPU cache memory 246. The program stack copy 250 is then worked through item by item within the processor 242, until it gets to the bottom of the program stack copy 250. Since items within a stack copied into in cache memory 246 are not independently addressable while in cache memory 246, any changes made to a global variable 252 within the program stack copy 250 are reported 253 back to the look-up table 254 before the next program stack 240 is called and loaded into cache memory 246. Items organized in program stacks 240 are independently addressable when they are heaped together in main memory 244. This allows the look-up table 254 to update 256 (4×) the global variable 252 at all the locations within all the program stacks 240 before the next program stack 240 is called into cache memory 246 for subsequent processing. Similarly, if the program stack copy 250 encounters a logical function 258 that calls for a program jump, the program stack copy 250 is halted, any changes previously made to a global variable 252 are updated 256 (4×) through the look-up table 254. The remaining items 260 in the original program stack copy 250 are discarded before the "jump-to" program stack copy 262 is transferred 263 into cache memory 246 and placed at the top 264 of its operational stack.

Although this operating system represents the most efficient general purpose computational architecture currently available it does contain several inefficiencies that are circumvented by this invention. First, it should be noted that low powers are needed to store data bytes in "static" memory. Maximum power loss occurs during the dynamic-access processes needed to copy, transfer, and restore (update) a given data byte that is already stored at a specific address in main memory 244. Larger power inefficiencies result when the same data structure has to be updated 256 (4×) in multiple locations within a plurality of program stacks 240 heaped into main memory 244. It is therefore desirable to enable a general purpose computational operating system that minimizes power loss by updating a global variable that exists only at one address in main memory, or by eliminating the need to replicate data structures and function blocks within multiple program stacks 240. Similarly, a significant number of operational cycles are wasted when loading and discarding the remaining items 260 of a program stack copy 250 following a program jump. It is therefore desirable to enable a general purpose computational operating systems that minimizes operational cycles by never having to copy, load, and discard the remaining items 260 within a program stack copy 250 following a program jump. By eliminating the additional transistors and instruction sets needed to manage wasteful operational cycles and memory swaps, the power reduction enabled by the hybrid computer module 100 that is cited for 6-core and 9-core processors in Table I can be further reduced by an additional 30%-75% through a more efficient operating system.

A very meaningful embodiment of the invention shown in FIG. 7D is a computational operating system 265 enabled by the hybrid computing module 100 that uses the memory management architecture 220 to minimize power loss and wasted operational cycles. The operating system 265 compiles a collection of program stacks 266 heaped into main memory 267, wherein the series of sequenced items 268 within each of the program stacks 266 are not copies of process-defining instruction sets and data 269, but pointers 270 to the memory addresses 271 of the desired process-defining instruction sets and data 269, which remain statically stored in main memory 267. When a first selected program stack 266A is called by the processor 272, the top item 268A of the first selected program stack 266A is copied 273 into the memory controller 274, which then uses the pointer 270 copied from the top item 268A to load a copy 275 of the corresponding process-defining instruction set or data 269A into the processor 272. Following this protocol, the operating system 265 executes the desired computational process by working its way through the first selected program stack 266A by copying the next pointer 270 listed in the next item 268 of the first selected program stack 266A and loading 275 its corresponding process-defining instruction sets and data 269 in the order their pointers 270 are organized in the first selected program stack 266A. When a change is made to a global variable 276 after it has been loaded into the processor 272, the loading process 273 is halted to allow the memory management variable 230 to notify the look-up table 277. The look-up table 277 in-turn updates 278A the global variable 276 at the address 271 it is stored statically at its primary location in main memory 267. There is no need to consume power and waste operational cycles updating the global variable 276 at multiple locations in main memory 267, since the program stacks 266 never store copies of the global variable 276, they only comprise pointing items 268B that store the pointer to global variable 270A. This allows all program stacks 266 containing pointing items 268B to remain unchanged and still operate as intended when called into the processor 272 following an update to the global variable 276.

The computational operating system 265 enables similar reductions in power consumption and wasted operational cycles during program jumps. When an item that maps a logical function 279 embedded within the first selected program stack 266A that calls for a jump to a new program stack 266B, the memory management variable 230 halts the loading process 273 before the discarded items 280 are copied and loaded into the controller 274. The memory management variable 230 in-turn uses the look-up table 277 to instruct the controller 274 to address the top item 281 on new program stack 266B. This starts the process of copying 282 the pointing items 268 in the new program stack 266B into the controller 274, which, in-turn, loads 275 the instruction sets and data 269 that execute the computational process defined within new program stack 266B into the processor 272.

The memory management variable 230 may also be used to store new instruction sets and/or 269B defined by processes completed in the processor 272 at a new address 271A main memory 267. While this embodiment achieves maximal efficiencies maintaining stack-based and heap-based memory functions in main memory 222,244, that does not preclude the use of this computational operating system 265 from fully loading program stacks into an optional cache memory 228 and still fall within the scope of the invention.

Figure 7E:
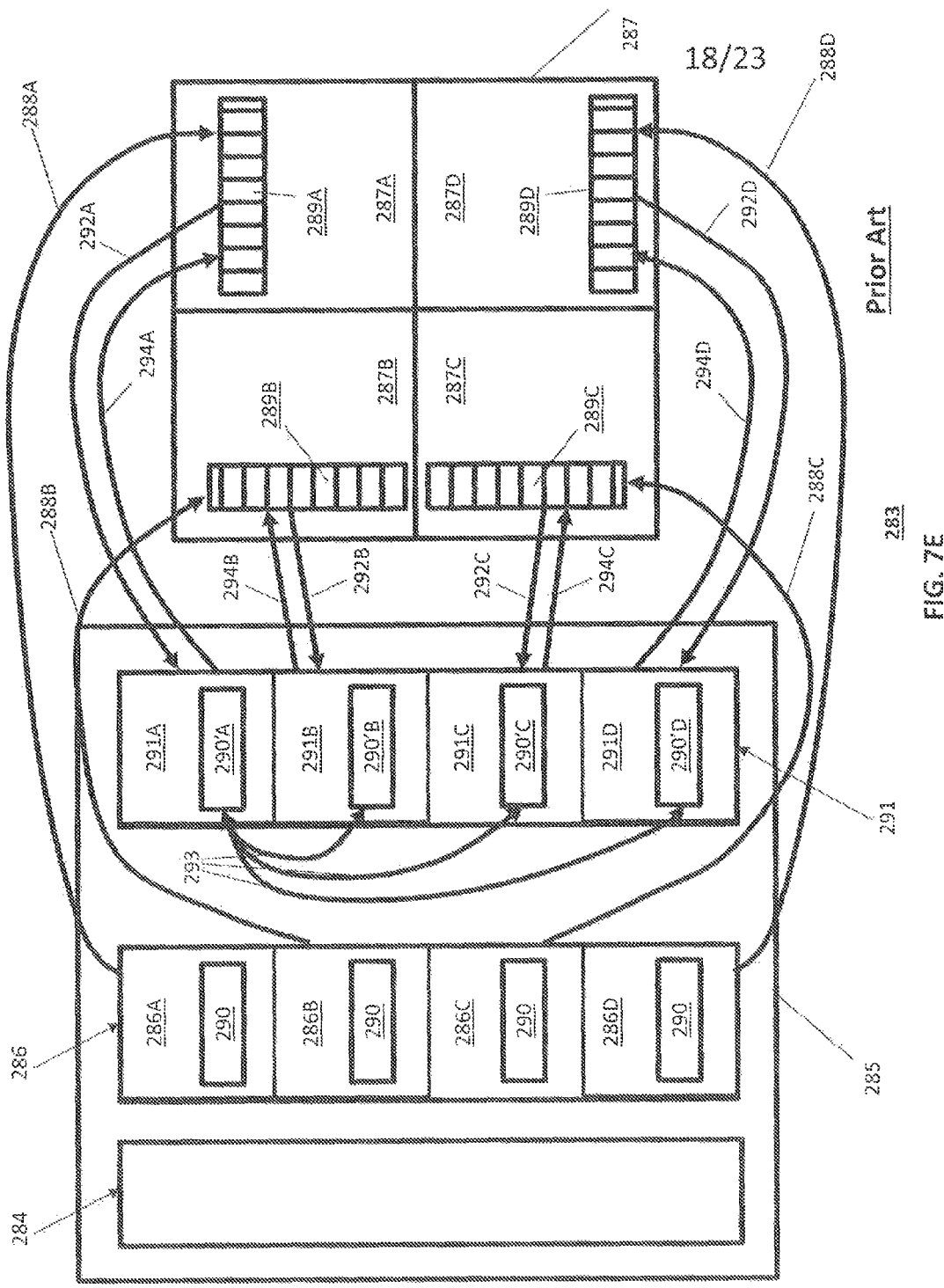
Figure 7F:
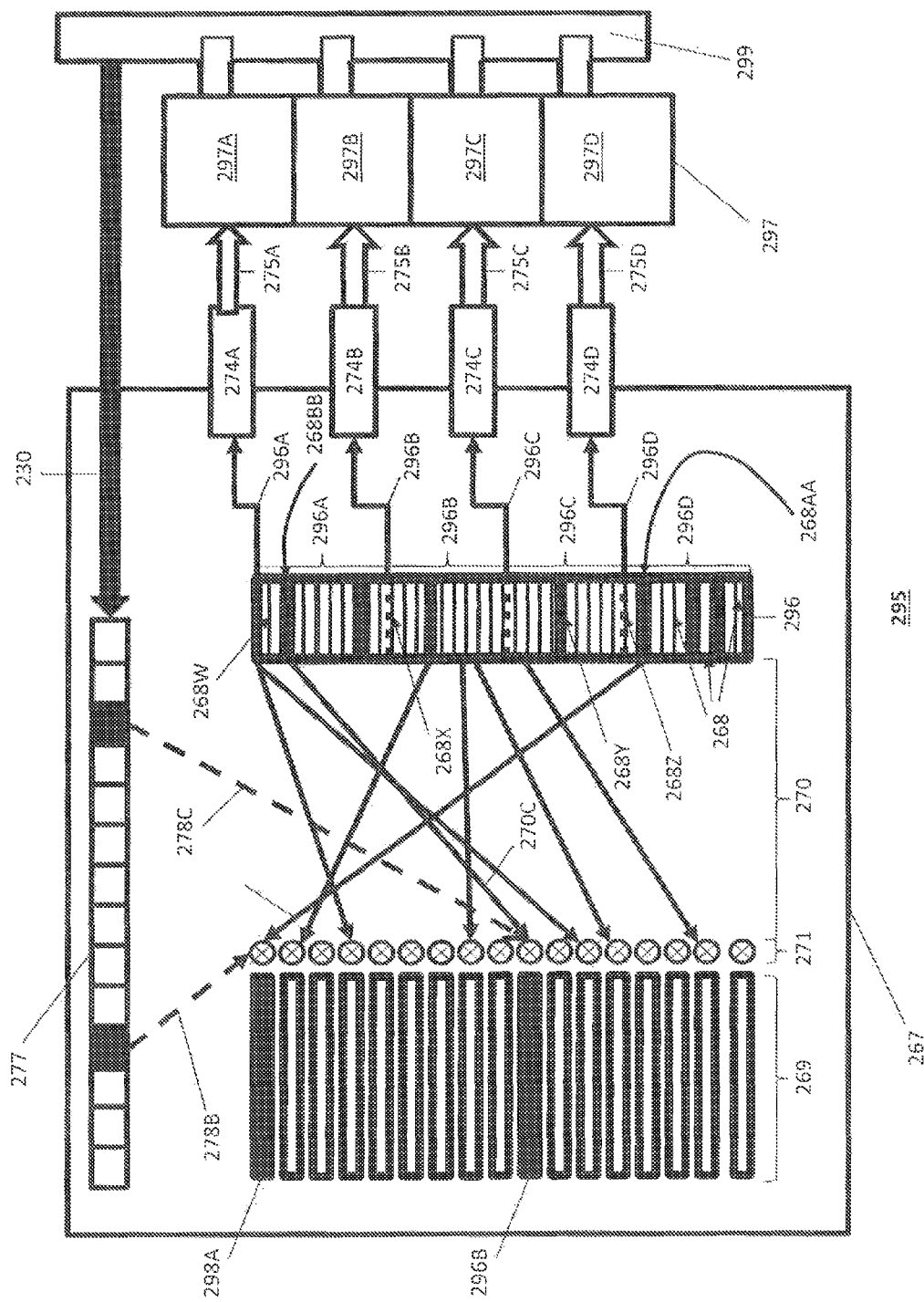

Reference is now made to FIGS. 7E, 7F to illustrate the inherent benefits of the present invention when applied to resolving major operational inefficiencies in conventional multi-core microprocessor architectures 283. In this instance, a collection of code items for a program stack 284 (variables and instruction sets) is stored in main memory 285. A program stack 286 is generated with stack subdivisions 286A,286B,286C,286D and stored within the heap (not shown) located in main memory 285. The stack subdivisions 286A,286B,286C,286D are code blocks ("short stacks") structured to be threaded between multiple processor cores 287A,287B,287C,287D operating on a single multi-core microprocessor die 287. When the program stack 286 is called by the processor 287, the subdivisions 286A, 286B,286C,286D in the program stack 286 are copied and mapped 288A,288B,288C,288D into the processor cores' 287A,287B,287C,287D cache memory banks 289A,289B, 289C,289D where they are subsequently processed. The code blocks contain data, branching, iterative, nested loop, and recursive functions that operate on local and global variables. Each of the subdivisions 286A,286B,286C,286D maintain a register 290 of the shared global variables that are simultaneously processed among the multiple processor cores 287A,287B,287C,287D. Once an alert to a change in a global variable has been flagged by a register 290, all of the processors have to be halted since none of the items in the running code blocks within subdivisions 286A,286B, 286C,286D are independently addressable in the cache memory banks 289A,289B,289C,289D. This requires a swap memory stack 291 to be created in main memory 285 where the uncompleted stack subdivisions 291A,291B, 291C,291D are copied and mapped 292A,292B,292C,292D from the cache memory banks 289A,289B,289C,289D in the multiple processor cores 287A,287B,287C,287D. Once in main memory 285, the swap stack registers 290'A,290'B, 290'C,290'D can update 293 the addressable items within the uncompleted stack subdivisions 291A,291B,291C,291D. Once updated, the uncompleted stack subdivisions 291A, 291B,291C,291D can be reloaded 294A,294B,294C,294D back into their respective processor cores 287A,287B,287C, 287D so the computational process defined by the program stack 286 can be completed. As is evident from the complexity of FIG. 7E, this process (described with great simplification herein) requires intensive code executions to complete the mapping process and relies heavily upon "fetch"/"store" commands that are very wasteful of power budgeted to main memory 285. Therefore, methods that sharply reduce the code complexity and minimize the usage of "fetch"/"store" commands while updating a global variable processed within a multi-core microprocessor die 287 is very desirable.

The intrinsic efficiency of the disclosed multi-core operating system 295 is illustrated in FIG. 7F. As is the case with the single-threaded computational operating system 265, the multi-core operating system 295 compiles and heaps a subdivided program stack 296 into main memory 267, wherein the series of sequenced items 268 within each of the program stack subdivisions 296A,296B,296C,296D are not copies of process-defining instruction sets and data 269, but pointers 270 to the memory addresses 271 of the desired process-defining instruction sets and data 269, which remain statically stored at their primary locations in main memory 267. When the program stack subdivisions are called by their respective processor cores 297A,297B,297C,297D integrated within the multi-core microprocessor die 297, the top items 268W,268X,268Y,268Z of each of the program stack subdivisions are copied in parallel 296A,296B,296C, 296D into the memory controllers 274A,274B,274C,274D of their respective processor cores 287A,287B,287C,287D. The memory controllers then 274A,274B,274C,274D use the pointers 270 copied from the top items 268W,268X, 268Y,268Z to load a copies 275A,275B,275C,275D of the process-defining instruction set or data 269A corresponding to the loaded pointers 270 into the processor cores 297A, 297B,297C,297D. When a change is made to a first global variable 298A because the item 268AA that records its pointer 270B is positioned closer to the top within its own subdivided stack 296D than any other global variable is positioned in any of the other subdivided stacks 296A,296B, 296C, an alert is registered that halts the memory controllers' 274A,274B,274C,274D loading processes. The memory management variable 230 is communicated over the interrupt bus 299 to the look-up table 277, which in-turn updates 278B the first global variable 298A statically stored at the address 271 mapped with pointer 270B. Similarly, when a change is made to a second global variable 298B because the item 268BB that records its pointer 270C is now closest to the top within its own subdivided stack 296A than any other global variable is positioned in any of the other subdivided stacks 296B,296C,296D, another alert is registered that halts the memory controllers' 274A,274B,274C, 274D loading processes. The memory management variable 230 is communicated over the interrupt bus 299 to the look-up table 277, which in-turn updates 278B the first global variable 298B statically stored at the address 271 mapped with pointer 270C. Any of the processor cores 297A,297B,297C,297D would execute an analogous procedure for a single-threaded CPU 272 as illustrated in FIG. 7D when managing program jumps with higher efficiency.

In conclusion, reference is now made to FIGS. 8A, 8B, 9A, 9B to illustrate embodiments of the invention that relate to a general purpose stack-machine computing module. Stack-machine computing architectures were used on many early minicomputers and mainframe computing platforms. The Burroughs B5000 remains the most famous mainframe platform to use this architecture. RISC eventually enabled register-based cache computing architectures to displace stack-machine computing in broader applications as general purpose computing grew in complexity and hardware limitations imposed stricter requirements on memory management. Furthermore, advances in software and hardware combined to make it difficult for stack-machine systems to operate High-Level Languages, such as ALGOL and the suite of C-languages derived from it. These developments made stack-machine computing inefficient in general purpose applications, though it remains an attractive option in limited-use/specific-purpose embedded processors. Stack machine architectures are also implemented in certain software applications (JAVA and Adobe POSTSCRIPT) by configuring the processor and cache memory as a virtual stack machine.

In the context of a stack machine, a stack 300 (see FIG. 8A) is an abstract data structure that exists as a restricted linear or sequential collection of items 302 that have some shared significance to the desired computational objective. The items are loaded into the stack 300 in a Last-In-First-Out ("LIFO") structure, which is very useful for block-oriented languages. The stack contains a list of "operands" 304a,304b,304c,304d,304e sequenced in the linear collection 302 near the top of the stack. These operands 304a, 304b,304c,304d,304e are operated upon together in a controlled fashion through another linear series 306 of operations ("operators") 308a,308b,308c,308d. In a generic stack machine the individual operators 308a,308b,308c, 308d comprise primitive elements of a more complex algorithm encoded within the linear series 306. Each of the individual operators 308a,308b,308c,308d are applied using post-fix notation to the top of the stack 300 by means of push 310 and pop 312 commands, that add and remove the operators 308a,308b,308c,308d in their coded sequential order. Each of the operators 308a,308b,308c,308d applies its primitive operation to the top two items in the sequential collection 302. The first operator 308a is applied to the top two operands 304a,304b in the stack. The resultant value is then returned to the top of the stack as the operator is popped 310 off the top of the stack. The sequential process continues in post-fix notation until all of the remaining operators 308b,308c,308d are applied to all of the remaining operands contained within the stack 300 to complete the algorithmic calculation. After the first operation is completed, the stack will comprise the resultant of 308a applied to 304a,304b inserted to the top of the stack and 304c,304d,304e. The second operator 308b is then applied to the resultant of 308a applied to 304a,304b and item 304c, which now occupies the second position in the stack 300. The process continues until the last operator 308d is applied to the resultant of the two operands 304c,304d immediately before the last operand item 304e in the stack 300. The final resultant is then inserted into the top of the stack 300 to be dispatched and used in the next step of the program.

The stack 300 will typically contain non-operand items in the stack, such as addresses, function calls, records, pointers (stack, current program and frame), or other descriptors needed elsewhere in the computational process. The process depicted in FIG. 8B depicts how stacks are implemented in the most generic (simplest) conventional stack machine 320. FIG. 8B also illustrates how stack machine computing is ideal for recursive computations, which progressively update and operate on the first two elements of a series, or nested functions that run a local variable through a series of operations until the desired output is generated. In conventional stack machines 320, the data stack 322, return stack 324, program counter 326, and the top-of-the-stack ("TOS") register 328 are embedded in cache memory 330 integrated into the processor core 332. The data stack 322 loads the top item of the stack into the top-of-the-stack ("TOS") register or buffer 328. The second item (now moved to the top) in the data stack 322 is simultaneously loaded through the data bus 334 as a pair with the item stored in the TOS register 328 into the arithmetic and logic computational unit ("ALU") 336 where the primitive element operator (logical or arithmetic) is applied to the two operands. The resultant value of the ALU 336 is then placed in the TOS register 328 to be loaded back into the ALU 336 with the next item that has moved to the top of the data stack 322. The program counter 326 stores the address within the ALU 336 of the next instruction to be executed. The program counter 326 may be loaded from the bus when implementing program branches, or may be incremented to fetch the next sequential instruction from program memory 338 located in main memory 340.

The ALU 336 and the control logic and instruction register (CLIR) 342 are located in the processor core 332. The ALU 336 comprises a plurality of addresses consisting of transistor banks configured to perform a primitive arithmetic element that functions as the operator applied to the pair of items sent through the ALU 336. The return stack is a LIFO stack used to store subroutine return addresses instead of instruction operands. Program memory 338 comprises a fair amount of random access memory and operates with the memory address register 344, which records the addresses of the items to be read onto or written from the data bus 334 on the next system cycle. The data bus 334 is also connected to an I/O port 346 used to communicate with peripheral devices.

In many instances, the number of instructions needed in stack-based computing can be reduced by as much as 50% compared to the number of instructions needed by register-based systems because interim values are recorded within the stack 300. This obviates the need to use additional processor cycles for multiple memory calls (fetch and restore) when manipulating a "local variable". Table II contrasts the processor cycles and code density needed to process simple A+B−C and D=E instruction sets in stack-based and register-based computing systems to illustrate the minimal instruction set computing ("MISC") potential of stack machines.

TABLE II

| | Stack | Register |
|---|---|---|
| Operation Code | A B + C − (post-fix notation) push val A push val B add push val C sub | A + B − C load r0, A load r1, B add r0, r1;; r0 + r1 -> r0 load r2, C sub r0, r2;; r0 − r2 -> r0 |
| Operation Code | D E = (post-fix notation) push val D push val E store | D = E load r0, ads D load r1, val B store r1, (r0);; r1 -> (r0) |

The code density of stack machines can be very compact since no operand fields and memory fetching instructions are required until the computational objective is completed. There is no need to allocate registers for temporary values or local variables, which are implicitly stored within the stack 300. The LIFO structure also facilitates maintenance and storage of activation records within the stack 300 during the transfer of programmatic control to subroutines. However, the utility of stack machines has become limited in more complex operations that require pipelining and multi-threading, or the maintenance of real-time consistency of global values over a broader network such as a computing cloud.

In early computing embodiments, stacks 300 were processed entirely in main memory. While this approach made the system slow, it allowed all items in the stack 300 to be independently addressable. However, as microprocessor speeds increased beyond the ability of physical memories to keep pace, stacks had to be loaded into cache memory where the items are not independently addressable. This limitation amplified the intrinsic inflexibility of working with restricted sequential collections of operand items 302 and linear instruction sets 308. Consequently, modern stack machines started losing their competitive edge as general purpose applications required larger numbers of global variables to maintain their consistency as they are being simultaneously processed in various program branches within a plurality of stacks that could be located across a multiplicity of processor cores. Additionally, some computational problems require conditional problem solving where it is advantageous to modify a sequence of instructions based upon the conditional response of an earlier computation.

The inability to address global variables or instructions buried within a stack in a timely manner generated additional high-density micro-coding needed to unload the stack, update the global variable or instruction sequence buried within it, and reload all the items back into the stack(s). This complexity and code density undermined the intrinsic efficiency of stack machines and allowed register machines to run far faster on less code. The efficiencies of higher-level language requirements enabled by compiler optimizations further restricted stack machines, which require structured languages, like FORTH or POSTSCRIPT, to achieve optimal efficiencies.

Despite these current disadvantages, stack architectures remain a preferred computing mode in limited small-scale and/or embedded applications that require high computational efficiencies because of their ability to be configured in ways that make computational use of every single available CPU cycle. This intrinsic advantage to stack architectures further enables fast subroutine linkage and interrupt response. These architectures are also emulated in virtual stack machines that require a less then efficient use of memory bandwidth and processing power. It is therefore desirable to provide a general purpose stack machine and operating system that processes computational problems with minimal instruction sets and transistor counts to minimize power consumption.

Figure 9A:
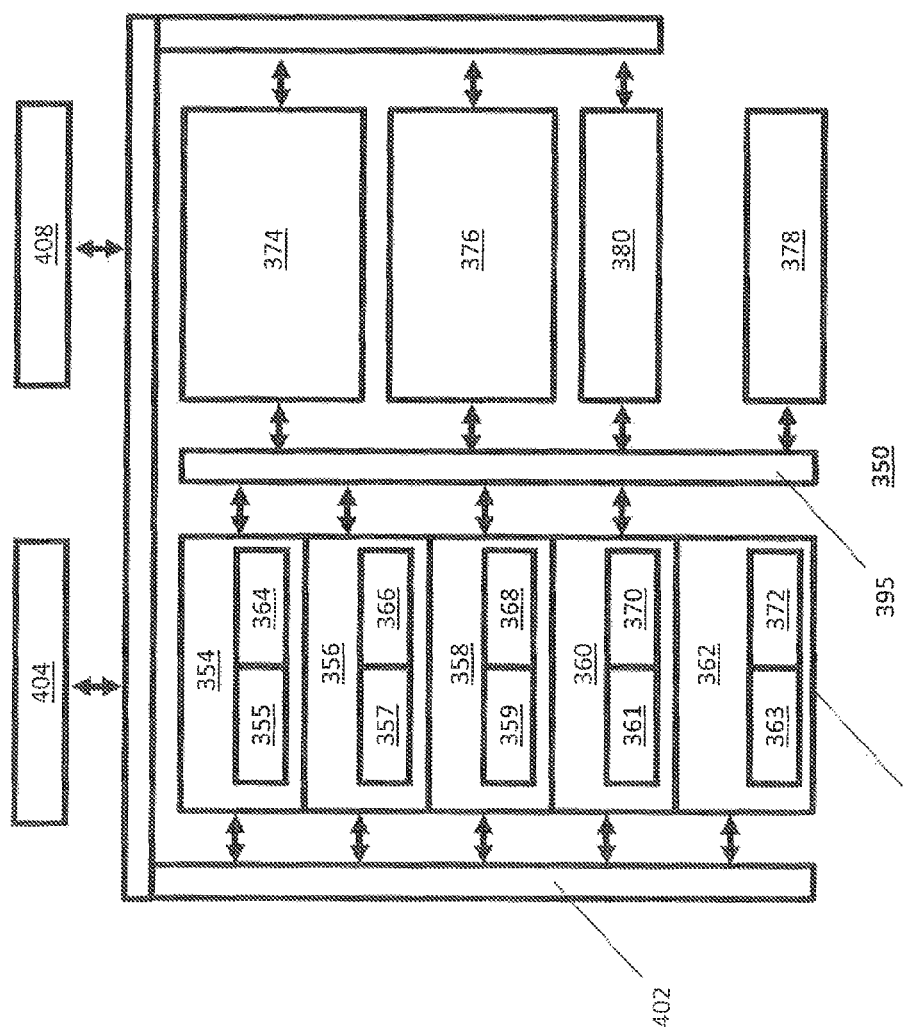

Reference is now made to FIGS. 9A, 9B to illustrate the general purpose stack machine module 350 that applies the memory management architecture 220 and computational operating system 265 to a conventional stack machine processor architecture. These enabling methods and embodiments overcome all the known limitations of conventional stack machines by simultaneously allowing global variables or instruction sets buried within multiple threaded stacks to be independently addressed and updated following a system interrupt. The general purpose stack-machine computing module 350 incorporates a hybrid computing module 100 wherein the module's main memory bank 352 has been allocated into multiple groupings comprising a stack memory group 354, a CPU/CPU memory group 356, a global memory group 358, a redundant memory group 360, and a general utility memory group 362. Each of the memory groupings 354,356,358,360,362 has its own memory address register/look-up table 355,357,359,361,363 and internal program counter 364,366,368,370,372 to administer program blocks assigned to the grouping.

The general purpose stack machine computing module's 350 operating system segregates its functional blocks to maximize efficiencies enabled the invention. Instruction sets and associated variables within nested functions and recursive processes are organized and stored in the stack memory group 354, which interfaces with the general purpose stack processor 374 designed to run with optimal code, power, and physical size efficiencies. Block program elements that have an iterative code structure have their instruction sets and associated variables stored and organized in the CPU/GPU memory group 356. Global variables, master instruction sets, and the master program counter is stored in the global memory group 358, which interfaces a master processor. The master processor could either the CPU/GPU processor (s) 376 or the general purpose stack processor 374 and administers the primary iterative code blocks. The redundant memory management group 360 is used to interface the general purpose stack machine computing module 350 with redundant systems or backup memory systems connected to the module through its I/O system interface 378. The general utility memory management group 362 can be subdivided into a plurality of subgroupings and used to manage any purpose not delegated to the other groups, such as system buffering, or memory overflows. A master controller and instruction register 380 coordinate data and process transfers and function calls between the main memory bank 352, the CPU/GPU processor(s) 376, the general purpose stack processor 374, and the I/O system interface 378.

Stack machine computers have demonstrated clear efficiency gains, measured in terms of processing speed, transistor count (size), power efficiency, and code density minimization, when applied to nested and recursive functions. Although conventional processors using register-based architectures can be configured as a virtual stack machine, considerable power and transistor counts savings are only achieved by applying structured programming languages (FORTH and POSTSCRIPT) to processors having matching machine code. For example, the Computer Cowboys MuP21 processor, which had machine code structured to match FORTH, managed 100 million-instructions-per-second ("MIPS") with only 7,000 transistors consuming 50 mW. This represented a 1,000-fold decrease in transistor count, with associated benefits to component size/cost and power consumption over equivalent processors utilizing conventional register architectures. However, the intrinsic programmatic inflexibility of stack machines inherent to the imposition of a fixed-depth stack that is not directly accessible has forced leading stack machines (Computer Cowboys MuP21, Harris RTX, and the Novix NC4016) to be withdrawn from the marketplace. These limitations have relegated modern stack machines to peripheral-interface-controller (PIC) devices.

Therefore, a specific embodiment of the general purpose stack machine computing module 350 incorporates an ASIC semiconductor die 122 to function as the module's stack processor 374, wherein the ASIC die 122 is designed with machine code that matches and supports a structured programming language, preferably the FORTH or POSTSCRIPT programming languages. Since the primary objective of the invention is to develop a general purpose stack machine computing module, and an FPGA can be encoded with machine code that matches a structured programming language, a preferred embodiment of the invention comprises a general purpose stack machine computing module 350 that incorporates an FPGA as its stack processor 374, or an FPGA configured as a stack processor 374 comprising multiple processing cores (not shown to avoid redundancy). Additionally, since the same efficiencies that enable minimum instruction set computing and maximum use of every operational cycle further enable efficient branching in main memory by changing a linear series 308 of operators applied to a linear collection 306 of operands before they are loaded into a stack processor 374, it is a meaningful preferred embodiment of the invention to use the stack processor to manage iterative code blocks.

The general purpose stack machine computing module's 350 operating system organizes the stack memory group 354 (see FIG. 9A) to have a data stack register 382, a return stack register 384, and one or more instruction stack registers 386. The one or more instruction registers 386 are used to store functions or subroutines as operator sequences, and can also be used to store instructions used by the stack processor 374 for retrieval at a later time. Each stack register 382,384,386 comprises memory cells 388 that contain the memory address (or pointer) of the item to be loaded program stack. The flexibility to change from one program stack to another, or change a global variable that is buried within a program stack, further allows program stacks to be manipulated using Last-In-First-Out ("LIFO") or First-In-First-Out ("FIFO") stack structures. Upon data stack initialization, the data-item address in the first cell (top) of the data stack register 382 is loaded into a stack butler utility 390 in the stack processor 374 during the first operational cycle. On the second operational cycle, the stack buffer utility 390 loads the first desired operand from the stack main memory 392 into the top-of-the-stack (TOS) buffer 394 through the data bus 395, while the next item-address listed in the data stack register 382 is loaded into the stack buffer utility 390 to configure it to load the second item in the data stack into the ALU operand buffer 396 during the subsequent operational cycle. To maximize operational efficiencies, the buffer utility 390 may also store a plurality of items that are address-mapped into its local register in exact sequence with the LIFO structure of the data stack register 382. This process of using the stack buffer utility 390 to translate a LIFO structure of item-addresses into a self-consistent list of items at processor clock-speeds allows a pre-determined sequence of operands to be loaded into the ALU operand buffer 396 as though the sequence was loaded directly from the data stack register. Once the TOS 394 and ALU operand 396 buffers are loaded with the first two items in the data stack, subsequent operational cycles simultaneously call the next operand(s) into the ALL operand buffer 396 in matching LIFO sequence with the list of corresponding address pointers originally loaded into the data stack register 382, while the resultant of the applied operation emerging from the ALU 398 is reloaded back into the TOS buffer 394. Although a list of address pointers loaded LIFO into the data stack register 382 is a preferred embodiment of the invention, it is inherent within the invention to load the items into the data stack register 382 and still maintain fundamental item-address-ability.

The return register 384 comprises the list of addresses that are used to permanently store a block of instructional code so it can be returned when the stack processor 374 has completed the block calculation. Similarly, the return register 384 is also be used to list the address used to temporarily house a block of code that was interrupted so it can be retrieved following a status interrupt and reinstated to complete its original task. These lists are also formatted in LIFO structure to more easily maintain programmatic integrity.

Figure 8A:
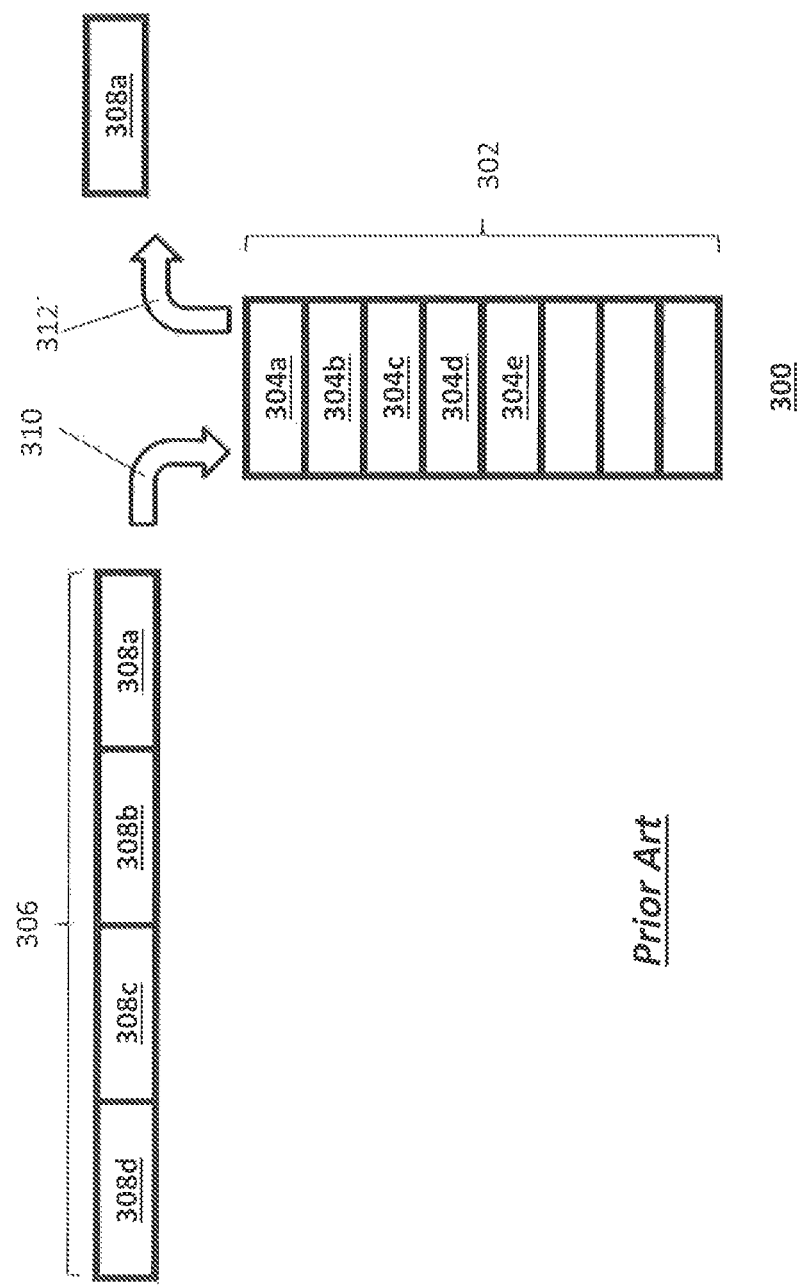

The instruction stack register 386 comprises a LIFO list of pointers to locations within the ALU 392 that represent specific machine-coded logical operations to be used as primitive element operators as described in FIG. 8A. The ALU address pointers in the instruction stack register 386 are sequenced to match primitive element algorithmic series to be applied to an associated set operands that will be loaded in tandem into the ALU 392. The LIFO sequence of operator addresses are compiled as a list of operators to complete any recursive or nested loop calculation desired with the stack processor 374.

The mathematical operators in the instruction register 386 arc loaded into the ALU 398 by means of an instruction set utility 400. The instruction set utility 400 activates input paths within the ALU 398 that load the operands stored in the TOS 394 and ALU operand 396 buffers into the pre-scribed logical operator. Left uninterrupted, the general purpose stack processor 374 allows all of the items specified in the data and instruction "stacks" (382,384) to be processed in a manner consistent with a conventional stack machine using minimal instruction sets, transistor counts, chip size, and power consumption.

The instruction set utility 400 can also be configured to record and copy a programmable fixed number of operand pairs and operators so they can be played hack again through the ALU 398 in proper sequence without affecting the instruction register 386.

A principal benefit of the stack processor 374 over, and its major distinction from, the prior art is its ability to use the memory management architecture 220 and computational operating system 265 to modify any global variable buried within a data stack 300 "on-the-fly" without a need to transfer the sequenced items in and out of cache to main memory to effectuate the global variable update, or waste operational cycles when making a program jump. This aspect of the invention couples a stack machine's inherent ability to execute fast subroutine linkages and interrupt responses with the invention's ability to load addressable items directly from main memory at speeds in step with the processors' operational cycle. This embodiment further enables the stack processor 374 to respond to a conditional logic interrupt triggered outside the stack or elsewhere in the system so it can operate alongside pipelined and multi-threaded CPU/GPU processor cores. This aspect of the invention allows the general purpose stack machine computing module 350 to support pipelined or multi-threaded general purpose architectures, which are additional embodiments of this invention.

An update to a buried global value is effectuated when an alert from the master controller and instruction register 380 signaling that a global variable has been changed from somewhere in the system. The global variable could be changed in additional cores within the stack processor 374, a neighboring CPU/GPU core 376, or another general purpose stack machine computing module 350 configured as a distributed or fault-tolerant computing element, or a networked system connected to the module 350 through the I/O system 378.

The master controller and instruction register 380 activates commands over the status interrupt bus 402 to temporarily halt traffic over the data bus 395. While data traffic is temporarily halted, the addressable item stored in stack main memory 392 that corresponds to the address pointer of the global variable loaded into the data stack register 382 is refreshed with the updated value from the global variable register 404. Once the updated global variable is confirmed, the global variable register 404 signals the master controller and instruction register 378 to resume traffic over the data bus 395.

In situations where the stack processor program counter 406 registers that the global variable recorded within the data stack register 382 has already been loaded into the stack buffer utility 390 or the ALU operand buffer 396, the updated value is loaded into the instruction set utility 400 during the system interrupt. The instruction set utility 400 then overrides the previously loaded operand with the updated global value during the cycle it is scheduled to be operated upon within the ALU 398.

In the event the global value to be updated was recently used to produce the value stored in the TOS buffer 394, the instruction set utility 400 is instructed to playback in reverse order the operands and operators it has copied and recorded, and then substitute the updated global value for the obsolete value before the interrupt is released. Alternatively, the instruction set utility 400 can use a series of operands and operators stored in the instruction stack register 386 to re-calculate the function with the updated global variable, if desired.

The memory management flexibility enabled by the invention further provides a general purpose stack machine computing module 350 comprising a general purpose stack processor 374 that can be halted by a logical interrupt command to accommodate instructions that re-orient the computational program to block stored within module main memory bank 352, or to an entirely new set of instructions that are pipelined in or threaded with other processors within or in communication with the module 350.

In the case of a locally generated program change, an interrupt flag originating from an internal logical process alerts the master controller and instruction register 380 to change the direction of the program based upon a pre-specified logical condition using any of the embodiments specified above, such as giving priority access to certain processes scheduled to run in the stack processor 374 or updating a global variable across main memory bank 352, or any peripheral memory (not shown) networked to main memory bank 352. The master controller and instruction register 380 issues commands to halt traffic on the data base 395 until the logical interrupt register 408 has loaded the high priority program blocks into the data stack 382, return stack 384, and instruction stack 386 registers, with all associated items placed in the stack memory group's 354 main memory 392. The pointers previously loaded into the registers can be either be pushed further down the register, or redirected to other locations within module main memory bank 352. Traffic is then restored to the data bus 395 allowing the higher priority process to run through to completion so the lower priority process then can be restored.

In situations where it is desirable to thread the stack processor 374 with other stack processing cores located elsewhere in the system (not shown), the logical interrupt register 408 alerts the master controller and instruction register 380 to halt traffic on the data bus 395. The stack program controller 406 coordinates with the instruction set utility 400 to record and store the state of the existing process so it can be restored at a later instance, while the logical interrupt register 408 pipelines the items from the external processor core(s) (not shown) through the status interrupt bus 402. Additional data stack 382, return stack 384, and instruction set 386 registers may be allocated during the process and the imported items could be stored in any reliable location in main memory bank 352. Pointers related to the threaded or pipelined processes address locations accessed through the I/O interface, system 378. Traffic over the data bus is reinitiated to activate computational processors in the stack processor 374, and the threaded processes/data may be interleaved to run continually with the internal processes.

While the invention is described herein with reference to the preferred embodiments, it is to be understood that it is not intended to limit the invention to the specific forms disclosed. On the contrary, it is intended to cover all modifications and alternative forms falling within the spirit and scope of the appended claims.

What is claimed:

1. A general purpose computational operating system that comprises a hybrid computer module, which further includes:
    a semiconductor chip carrier having electrical traces and passive component networks monolithically formed on the surface of a carrier substrate to maintain and manage electrical signal communications between:
    a microprocessor die mounted on the chip carrier;
    a memory bank consisting of at least one discrete memory die mounted on the semiconductor chip carrier adjacent to the microprocessor die;
    a fully integrated power management module having a resonant gate transistor embedded within it that synchronously transfers data from main memory to the microprocessor die at a processor clock speed;
    a memory management architecture and operating system that compiles program stacks as a collection of pointers to addresses where elemental code blocks are stored in main memory;
    a memory controller that sequentially references the pointers stored within the program stacks and fetches a copy of a program stack item referenced by a pointer from main memory and loads the copy into the microprocessor die;
    an interrupt bus that halts the loading when an alert to a program jump or change to a global variable is registered and sends a memory management variable to a look-up table;
    a look-up table that redirects the controller to a new program stack following a program jump before it reinitiates the loading;
    a look-up table that fetches and stores the change to a global variable at its primary location in main memory before it reinitiates the loading:
    wherein program stacks are mapped directly to physical memory and operated upon in real-time without the creation of a virtual copy of any portion of a program stack that is subsequently stored and processed by a desired processor using a minimal number of fetch/store commands and operational cycles.

2. A general purpose computational operating system as in claim 1 that further comprises a plurality of semiconductor die mounted upon it that provide central processing unit (CPU), graphics processing unit (GPU), field programmability, main memory control/arbitration, application-specific, bus management, or analog-to-digital and/or digital-to-analog functionality.

3. A general purpose computational operating system as in claim 2 wherein the CPU comprise multiple processing cores.

4. A general purpose computational operating system as in claim 2 wherein the CPU comprise multiple processing cores.

5. A general purpose computational operating system as in claim 2 wherein the CPU and GPU comprise multiple processing cores.

6. A general purpose computational operating systems as in claim 1 wherein any or all microprocessor die dedicate ≤45% of their transistor circuitry to servicing "fetch"/"store" code instructions.

7. A general purpose computational operating system as in claim 1 wherein any or all microprocessor die dedicate ≤25% of their transistor circuitry is dedicated to "fetch"/"store" code instructions.

8. A general purpose computational operating system as in claim 1 wherein a global variable interrupt look-up table is maintained in physical memory.

9. A general purpose computational operating system as in claim 1 wherein a global variable interrupt look-up table is maintained in cache memory.

10. A general purpose computational operating system as in claim 1 wherein a program jump look-up table is maintained in physical memory.

11. A general purpose computational operating system as in claim 1 wherein a program jump look-up table is maintained in cache memory.

12. A general purpose computational operating system as in claim 1 wherein the memory bank comprises static dynamic random-access memory (SDRAM).

13. A general purpose computational operating system as in claim 1 wherein the memory bank is a Hybrid Memory Cube.

14. A general purpose computational operating system as in claim 1 wherein the memory bank manages all stack-based and heap-based memory functionality for the microprocessor die and other semiconductor die serving logical processes.

15. A general purpose computational operating system as in claim 1 wherein the carrier substrate is a semiconductor.

16. A general purpose computational operating system as in claim 15 wherein active circuitry is embedded in the carrier substrate.

17. A general purpose computational operating system as in claim 16 wherein active circuitry embedded within the semiconductor substrate manages universal serial bus (USB), audio, video and other communications bus interface protocols.

18. A general purpose computational operating system as in claim 1 wherein the microprocessor die's cache memory is less than 16 mega-bytes per processor core.

19. A general purpose computational operating system as in claim 1 wherein the microprocessor die's cache memory is less than 128 kilo-bytes per processor core.

20. A general purpose computational operating system as in claim 1 wherein the computer module comprises a plurality of microprocessor die function as a distributed computing or fault tolerant computing system.

21. A general purpose computational operating system as in claim 1 includes an additional fully integrated power management module that is frequency off-stepped in from the fully integrated power management module to supply power to circuit elements at a slower switching speed.

22. A general purpose computational operating system as in claim 21 wherein the frequency off-stepped additional fully integrated power management module powers a baseband processor.

23. A general purpose computational operating system as in claim 1 wherein the fully integrated power management module is mounted on the semiconductor chip carrier.

24. A general purpose computational operating system as in claim 1 wherein the fully integrated power management module is farmed on the semiconductor chip carrier.

25. A general purpose computational operating system as in claim 1 wherein the fully integrated power management module contains a resonant gate transistor that switches power at speeds greater than 250 MHz.

26. A general purpose computational operating system as in claim 1 wherein the fully integrated power management module contains a resonant gate transistor that switches power at speeds in the range of 600 MHz to 60 GHz.

27. A general purpose computational operating system as in claim 1 wherein the program stacks are sequenced into sub-divisions and loaded in parallel into multiple processor cores.

28. A general purpose computational operating system as in claim 27 wherein an alert signaling a change to a global variable embedded within any program stack sub-division halts a program stack loading process to all processor cores through the interrupt bus until the global variable is updated at its primary location in main memory and global variable look-up tables reinitiates the loading process to all processor cores.

29. A general purpose computational operating system as in claim 1 that operates within a 32 bit, 64-bit 128-bit computing architecture.

30. A general purpose computational operating system as in claim 1 wherein the look-up table that manages global variable is located in main memory.

31. A general purpose computational operating system as in claim 1 wherein a look-up table that manages program jumps is located in main memory.

32. A general purpose computational operating system as in claim 1 wherein heap-based memory functionality is placed entirely in main memory.

33. A general purpose computational operating system as in claim 1 wherein heap-based memory and stack-based memory functions are managed directly from main memory.

34. A general purpose computational operating system as in claim 1 wherein a global variable is stored in just one primary location in main memory.

35. A general purpose computational operating system as in claim 34 wherein a global variable is stored in static dynamic random access memory (SDRAM).

36. A general purpose computational operating system as in claim 1 wherein the chip carrier is in thermal contact with a thermoelectric device.

37. A general purpose computational operating system as in claim 1 further comprises an electro-optic interface.

38. A general purpose computational operating system as in claim 1 wherein instruction sets are pipelined to a microprocessor die.

* * * * *

UNITED STATES PATENT AND TRADEMARK OFFICE
CERTIFICATE OF CORRECTION

PATENT NO. : 9,791,909 B2
APPLICATION NO. : 15/162739
DATED : October 17, 2017
INVENTOR(S) : L. Pierre de Rochemont Page 1 of 1

It is certified that error appears in the above-identified patent and that said Letters Patent is hereby corrected as shown below:

In the Claims

Column 35, Line 46 (Claim 24), the portion of the line reading "module is farmed on the" should read -- module is formed on the --

Column 36, Line 20 (Claim 29), the portion of the line reading "operates within a 32 bit, 64-bit 128-bit" should read -- operates within a 32-bit, 64-bit, 128-bit --

Column 36, Line 23 (Claim 30), the portion of the line reading "look-up table that manages global" should read -- look-up table that fetches and stores the change to the global --

Signed and Sealed this
Twenty-second Day of May, 2018

Andrei Iancu
*Director of the United States Patent and Trademark Office*